(12) United States Patent
Shin et al.

(10) Patent No.: US 11,114,997 B2
(45) Date of Patent: Sep. 7, 2021

(54) BULK-ACOUSTIC WAVE RESONATOR

(71) Applicant: SAMSUNG ELECTRO-MECHANICS CO., LTD., Suwon-si (KR)

(72) Inventors: Ran Hee Shin, Suwon-si (KR); Tae Kyung Lee, Suwon-si (KR); Sung Jun Lee, Suwon-si (KR); Hwa Sun Lee, Suwon-si (KR); Je Hong Kyoung, Suwon-si (KR); Sung Sun Kim, Suwon-si (KR); Jin Suk Son, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/418,107

(22) Filed: May 21, 2019

(65) Prior Publication Data

US 2020/0252046 A1 Aug. 6, 2020

(30) Foreign Application Priority Data

Jan. 31, 2019 (KR) ........................ 10-2019-0012507

(51) Int. Cl.
*H03H 9/02* (2006.01)
*H03H 9/15* (2006.01)
*H03H 9/17* (2006.01)
*H03H 9/54* (2006.01)

(52) U.S. Cl.
CPC .......... *H03H 9/17* (2013.01); *H03H 9/02007* (2013.01); *H03H 9/54* (2013.01)

(58) Field of Classification Search
CPC ......... H03H 9/02007; H03H 9/15; H03H 9/54

USPC ......................................................... 333/186
See application file for complete search history.

(56) References Cited

U.S. PATENT DOCUMENTS

| | | | |
|---|---|---|---|
| 6,355,498 B1* | 3/2002 | Chan .................. | B81C 1/00142 438/48 |
| 7,367,095 B2* | 5/2008 | Larson, III ............ | H03H 9/132 29/25.35 |
| 9,065,421 B2* | 6/2015 | Feng ...................... | H03H 9/173 |
| 9,679,765 B2 | 6/2017 | Larson, III et al. | |
| 2004/0227590 A1* | 11/2004 | Larson, III ............ | H03H 9/172 333/189 |
| 2005/0012568 A1* | 1/2005 | Aigner .................. | H03H 9/583 333/187 |
| 2008/0258845 A1* | 10/2008 | Schmidhammer ..... | H03H 9/589 333/195 |
| 2011/0180391 A1 | 7/2011 | Larson, III et al. | |

(Continued)

FOREIGN PATENT DOCUMENTS

| | | |
|---|---|---|
| JP | 4784815 B2 | 10/2011 |
| JP | 2012139923 A * | 7/2012 |

OTHER PUBLICATIONS

R. Nussl et al., Enhanced stress durability of nano resonators with scandium doped electrodes, 2010, Science Direct, 7 pages. (Year: 2010).*

*Primary Examiner* — Dean O Takaoka
(74) *Attorney, Agent, or Firm* — NSIP Law

(57) ABSTRACT

A bulk acoustic wave resonator includes a substrate, a seed layer disposed on the substrate, a first electrode disposed on the seed layer and including an aluminum alloy layer containing scandium (Sc), a piezoelectric layer disposed on the first electrode and including a layer having a cation (Al) polarity, and a second electrode disposed on the piezoelectric layer.

15 Claims, 12 Drawing Sheets

(56) References Cited

U.S. PATENT DOCUMENTS

| | | | |
|---|---|---|---|
| 2012/0177816 A1 | 7/2012 | Larson, III et al. | |
| 2015/0280687 A1* | 10/2015 | Burak | H03H 9/175 310/321 |
| 2016/0373083 A1* | 12/2016 | Lee | H03H 9/02015 |
| 2017/0047907 A1* | 2/2017 | Burak | H03H 9/171 |
| 2017/0288628 A1 | 10/2017 | Grannen et al. | |
| 2019/0326873 A1* | 10/2019 | Bradley | H03H 9/56 |

* cited by examiner

BULK-ACOUSTIC WAVE RESONATOR

CROSS-REFERENCE TO RELATED APPLICATION

This application claims the benefit under 35 USC 119(a) of Korean Patent Application No. 10-2019-0012507 filed on Jan. 31, 2019 in the Korean Intellectual Property Office, the entire disclosure of which is incorporated herein by reference for all purposes.

BACKGROUND

The following description relates to a bulk acoustic wave resonator.

Interest in 5G communications technology has been increasing, and technological developments have been undertaken in candidate bands.

In this regard, various methods to obtain a high frequency through bulk acoustic wave resonators have been adopted. Therefore, it is necessary to develop a structure in which a high frequency may be implemented while increasing thicknesses of piezoelectric layers and electrodes to secure sufficient film quality.

In addition, the development of a structure capable of controlling $Kt^2$ performance without deteriorating other performance aspects of bulk acoustic wave resonators is required.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

Examples provide a bulk acoustic wave resonator, in which $Kt^2$ may be controlled without deteriorating other physical properties by adjusting a thickness ratio based on a polarity, and the polarity of a piezoelectric layer, and a high frequency may be implemented with a thickness sufficient to prevent deterioration of physical properties of the piezoelectric layer and an electrode.

In one general aspect, a bulk acoustic wave resonator includes a substrate, a seed layer disposed on the substrate, a first electrode disposed on the seed layer and including an aluminum alloy layer containing scandium (Sc), a piezoelectric layer disposed on the first electrode and including a layer having a cation (Al) polarity, and a second electrode disposed on the piezoelectric layer.

The piezoelectric layer may be composed only of the layer having the cation (Al) polarity.

A content of scandium (Sc) contained in the first electrode may be 0.1 at % to 5 at %.

A doping material of the piezoelectric layer may include one of scandium, erbium, yttrium, lanthanum, titanium, zirconium and hafnium, or combinations thereof.

A content of the doping material in the piezoelectric layer may be 0.1 at % to 30 at %.

The second electrode may include an aluminum alloy layer containing scandium (Sc).

The second electrode may be composed of at least one of molybdenum (Mo), ruthenium (Ru), tungsten (W), iridium (Ir), platinum (Pt), copper (Cu), titanium (Ti), tantalum (Ta), nickel (Ni), or chromium (Cr), or may be composed of an alloy including any one thereof.

The piezoelectric layer may include a first piezoelectric layer disposed on the first electrode and having a cation (Al) polarity, and a second piezoelectric layer disposed on the first piezoelectric layer and having an anion (N) polarity.

A ratio of a thickness of the first piezoelectric layer to a thickness of the second piezoelectric layer may range from 1.63 to 5.25.

A ratio of a thickness of the first piezoelectric layer to a thickness of the second piezoelectric layer may range from 0.11 to 0.59.

The first piezoelectric layer and the second piezoelectric layer may have an interface therebetween at which an oxygen element is contained.

The piezoelectric layer may include a first piezoelectric layer disposed on the first electrode and having a cation (Al) polarity, an oxide layer disposed on the first piezoelectric layer, and a second piezoelectric layer disposed on the oxide layer and having an anion (N) polarity.

The bulk acoustic wave resonator may include a passivation layer disposed on the second electrode.

The bulk acoustic wave resonator may include an etch stop portion disposed between the substrate and the first electrode and disposed around a cavity.

The bulk acoustic wave resonator may include an insertion layer disposed below a portion of the piezoelectric layer.

The bulk acoustic wave resonator may include a cavity disposed in the substrate or above the substrate.

The substrate may include a reflective layer embedded in a groove or stacked on the substrate.

The seed layer may be disposed on a membrane layer, the membrane layer may form a cavity together with the substrate, and the seed layer may be composed of aluminum nitride (AlN).

In another general aspect, a bulk acoustic wave resonator includes a substrate; a first electrode disposed on the substrate; a piezoelectric layer disposed on the first electrode and including a first piezoelectric layer disposed on the first electrode and having a cation (Al) polarity, an oxide layer disposed on the first piezoelectric layer, and a second piezoelectric layer disposed on the oxide layer and having an anion (N) polarity; and a second electrode disposed on the piezoelectric layer.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
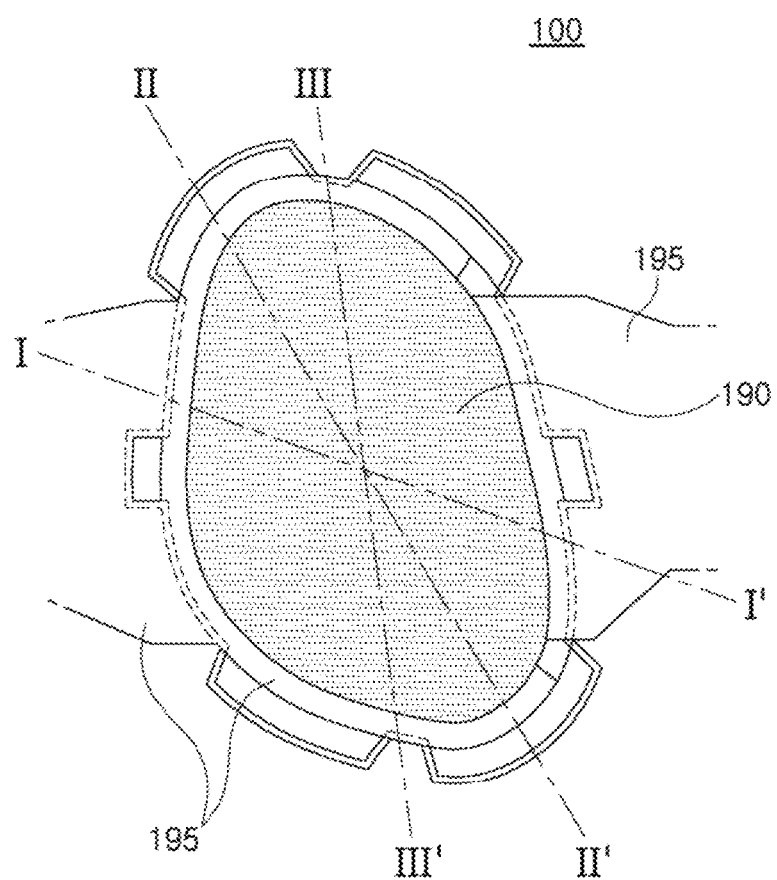
FIG. 1 is a schematic plan view illustrating a bulk acoustic wave resonator according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The drawings may not be to scale, and the relative size, proportions, and depiction of elements in the drawings may be exaggerated for clarity, illustration, and convenience.

Subsequently, examples are described in further detail with reference to the accompanying drawings.

Figure 2:
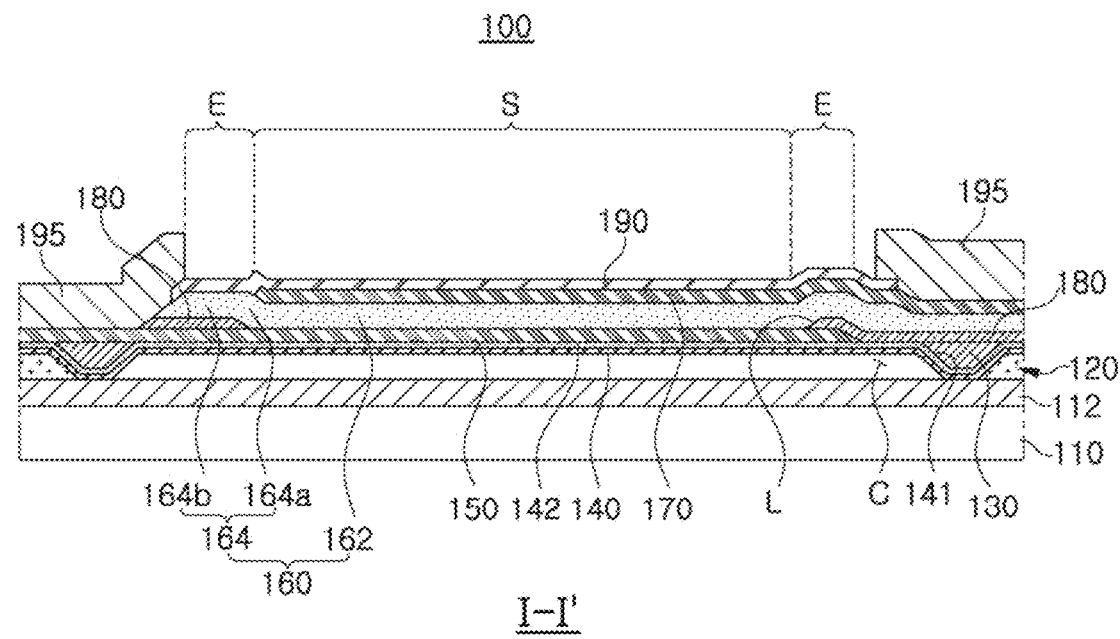
FIG. 2 is a cross-sectional view taken along line I-I' of FIG. 1.
Figure 3:
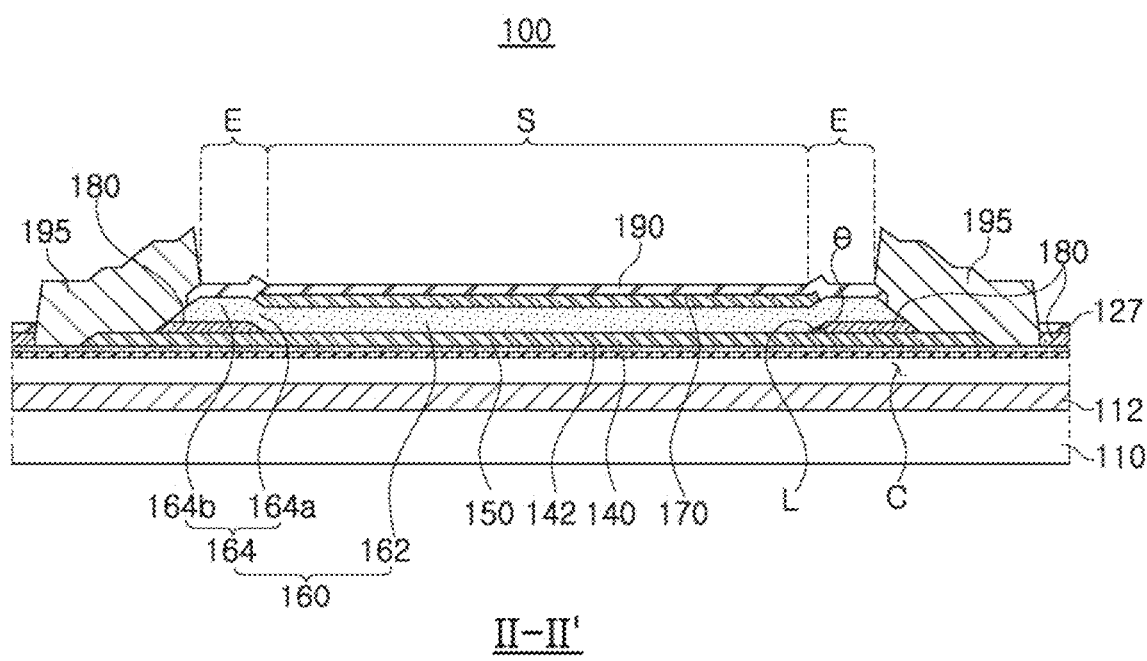
FIG. 3 is a cross-sectional view taken along line II-II' of FIG. 1.
Figure 4:
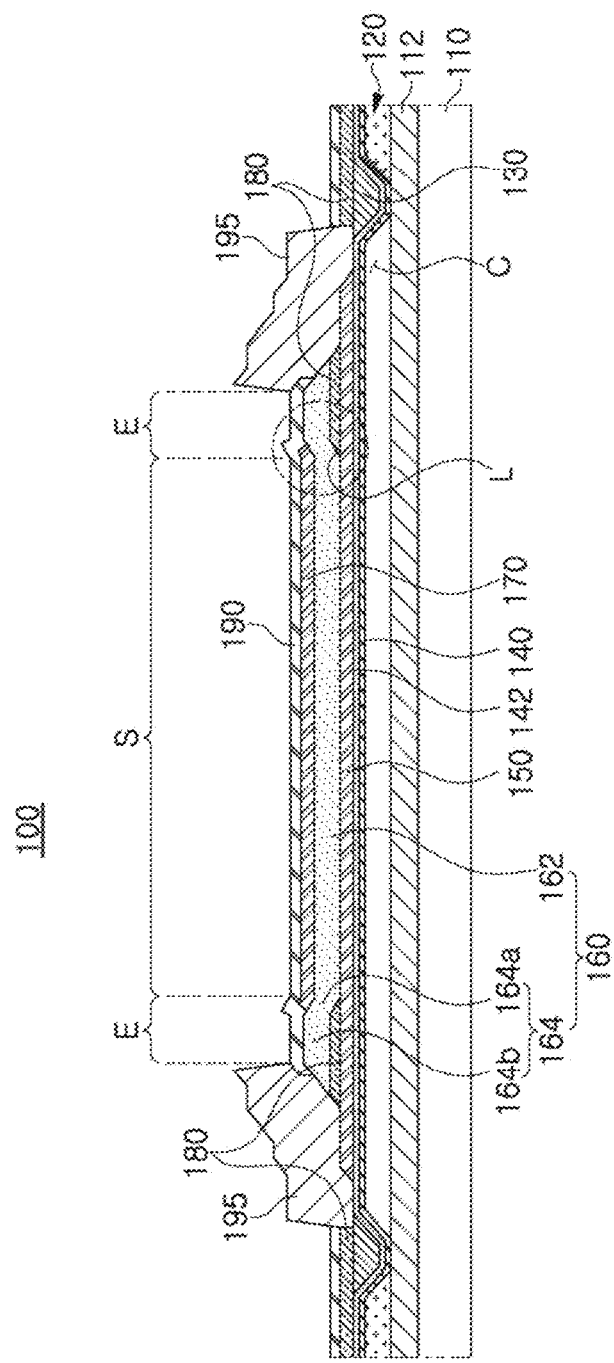
FIG. 4 is a cross-sectional view taken along line III-III' of FIG. 1.

FIG. 1 is a schematic plan view illustrating a bulk acoustic wave resonator according to an example, FIG. 2 is a cross-sectional view taken along line I-I' of FIG. 1, and FIG. 3 is a cross-sectional view taken along line II-II' of FIG. 1, and FIG. 4 is a cross-sectional view taken along line III-III' of FIG. 1.

Referring to FIGS. 1 to 4, a bulk acoustic wave resonator 100 may include a substrate 110, a sacrificial layer 120, an etch stop portion 130, a membrane layer 140, a first electrode 150, a piezoelectric layer 160, a second electrode 170, an insertion layer 180, a passivation layer 190, and a metal pad 195.

The substrate 110 may be a silicon substrate. For example, as the substrate 110, a silicon wafer may be used, or a silicon on insulator (SOI)-type substrate may be used.

An insulating layer 112 may be formed on an upper surface of the substrate 110, and may electrically isolate the substrate 110 from configurations disposed on an upper portion thereof. The insulating layer 112 prevents the substrate 110 from being etched by etching gas in a case in which a cavity C is formed during a manufacturing process.

The insulating layer 112 may be formed of at least one of silicon dioxide (SiO2), silicon nitride (Si3N4), aluminum oxide (Al2O2), and aluminum nitride (AlN), and may be formed using one of chemical vapor deposition, RF magnetron sputtering, and evaporation.

The sacrificial layer 120 is formed on the insulating layer 112, and the cavity C and the etch stop portion 130 may be disposed inside the sacrificial layer 120. The cavity C is formed by removing a portion of the sacrificial layer 120. As such, as the cavity C is formed inside the sacrificial layer 120, the first electrode 150 and other layers disposed on the sacrificial layer 120 may be formed to be flat.

The etch stop portion 130 is disposed along a boundary of the cavity C. The etch stop portion 130 prevents etching from progressing beyond a cavity area when the cavity C is formed.

The membrane layer 140 forms the cavity C together with the substrate 110. The membrane layer 140 may be formed of a material having a low reactivity with the etching gas when the sacrificial layer 120 is removed. The etch stop portion 130 is inserted into a groove 141 formed by the membrane layer 140. As the membrane layer 140, a dielectric layer including a material including any one of silicon nitride (Si3N4), silicon oxide (SiO2), manganese oxide (MgO), zirconium oxide (ZrO2), aluminum nitride (AlN), lead zirconate titanate (PZT), gallium arsenic (GaAs), hafnium oxide (HfO2), aluminum oxide (Al2O3), titanium oxide (TiO2), and zinc oxide (ZnO) may be used.

A seed layer 142 formed of aluminum nitride (AlN) may be formed on the membrane layer 140. For example, the seed layer 142 may be disposed between the membrane layer 140 and the first electrode 150. The seed layer 142 may be formed using a dielectric or metal having a hexagonal close-packed (HCP) crystal structure in addition to aluminum nitride (AlN). As an example, when the seed layer 142 is a metal layer, the seed layer 142 may be formed of titanium (Ti).

The first electrode 150 is formed on the membrane layer 140, and a portion of the first electrode 150 is disposed on an upper portion of the cavity C. The first electrode 150 may be used as either an input electrode or an output electrode for inputting and/or outputting an electrical signal such as a radio frequency (RF) signal or the like.

The first electrode 150 may be formed of an aluminum alloy containing scandium (Sc), as an example. Since the first electrode 150 is formed of an aluminum alloy containing scandium (Sc), mechanical strength thereof may be increased and high power reactive sputtering may be performed. Surface roughness of the first electrode 150 may be prevented from increasing and high orientation growth of the piezoelectric layer 160 may be induced under such deposition conditions.

Since the scandium (Sc) is present in the first electrode 150, chemical resistance of the first electrode 150 is increased, and a disadvantage that occurs in a case in which the first electrode is formed of pure aluminum may be compensated for. Further, process stability such as dry etching or wet processing may be secured in manufacturing.

Further, in a case in which the first electrode is formed of pure aluminum, oxidation may be easily caused. However, since the first electrode 150 is formed of an aluminum alloy containing scandium, chemical resistance to oxidation may be improved.

In detail, first, an electrode is formed of a molybdenum (Mo) material and an aluminum alloy (AlSc) containing scandium to have a thickness of 1500 Å, and sheet resistance thereof may be measured. In this case, when the electrode is formed of a molybdenum (Mo) material, the sheet resistance is 0.9685, while when the electrode is formed of an aluminum alloy (AlSc) containing 0.625 at % of scandium, the sheet resistance is 0.316. As described above, it may be appreciated that when the electrode is formed of an aluminum alloy (AlSc), the sheet resistance is reduced as compared with the case in which the electrode is formed of the molybdenum (Mo) material.

On the other hand, the content of scandium (Sc) may be 0.1 at % to 5 at %. For example, if the content of scandium (Sc) is less than 0.1 at %, mechanical property deterioration and hillocks may be caused by aluminum (Al), and if the content of scandium (Sc) is 5 at % or more, it may be difficult to reduce electrical loss indicating sheet resistance. In addition, if the content of scandium (Sc) increases, the surface roughness may increase, which may adversely affect crystal orientation.

TABLE 1

| Material | Yield Strength | Elongation |
|---|---|---|
| Pure Al | 35 Mpa | 45% |
| AlSc (Sc 0.625 at %) | 300 Mpa | 15% |

Figure 5:
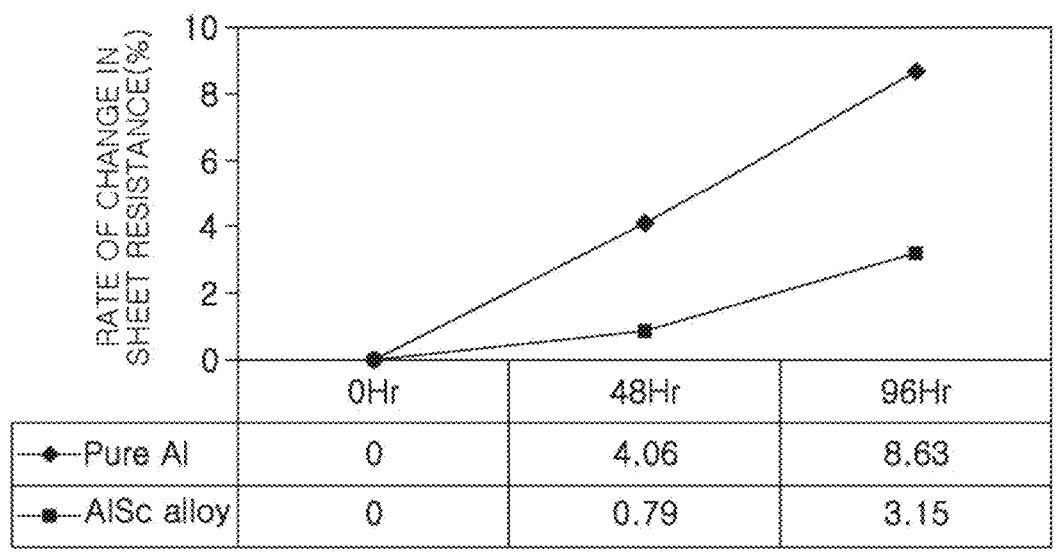
FIG. 5 is a graph illustrating rates of sheet resistance change of pure aluminum and an aluminum alloy containing scandium.

As illustrated in Table 1, yield strength is increased and elongation is decreased in the case of the aluminum alloy containing scandium (AlSc, 0.625 at %), as compared with the case of pure aluminum (Al). In addition, as illustrated in FIG. 5, the pure aluminum (Al) material and the aluminum alloy (AlSc, 0.625 at %) containing scandium were deposited to have a thickness of 1500 Å to measure a sheet resistance change in a reliable environment. As a result, it may be appreciated that a rate of change of sheet resistance after 96 Hr is about 50% in the case of the aluminum alloy (AlSc, 0.625 at %) containing scandium, as compared with that in the pure aluminum (Al), thereby exhibiting excellent oxidation resistance.

Also, since the first electrode 150 has excellent galvanic corrosion resistance with the metal pad 195, stability in a manufacturing process may be obtained. For example, a material of pure aluminum (Al) and an aluminum alloy containing scandium (AlSc, 0.625 at %) were deposited to have a thickness of 1500 Å and then contacted with gold (Au) that is mainly used as a material of the metal pad 195, and then immersed in an electrolyte solution for 65 hours, to compare galvanic corrosion characteristics. As a comparison result, no change in a surface was observed for the aluminum alloy containing scandium (AlSc, 0.625 at %), but corrosion with gold (Au) was observed in the pure aluminum material. Therefore, when the first electrode 150 is formed of an aluminum alloy (AlSc) containing scandium, properties for galvanic corrosion may also be secured in manufacturing. On the other hand, the first electrode 150 is formed of an aluminum alloy (AlSc) only containing scandium (Sc). For example, no additional metal except scandium (Sc) is contained in the first electrode 150. If additional metals other than scandium (Sc) are present, such an aluminum alloy forms a ternary phase diagram. In this case, it may be difficult to control a composition, and a complex phase system is caused, thereby causing the occurrence of compositional unevenness and an undesired crystal phase.

Further, when the first electrode 150 is formed of an aluminum alloy having a ternary system, the surface roughness is increased due to uneven composition and undesired crystal phase formation, which may adversely affect crystal orientation when the piezoelectric layer 160 is formed.

Thus, as the first electrode 150 is formed of an aluminum alloy (AlSc) containing only scandium (Sc), the crystal orientation of the piezoelectric layer 160 disposed on the first electrode 150 may be improved.

Further, as the first electrode 150 is formed of an aluminum alloy (AlSc) containing only scandium (Sc), a polarity of the piezoelectric layer 160 disposed on the first electrode 150 may have a cation (Al) polarity.

Since the first electrode 150 is formed of an aluminum alloy containing scandium (Sc), electrical loss may be reduced. Further, since mechanical strength may be improved, stability may be secured in a sputtering process, deposition of the piezoelectric layer 160 having a cation (Al) polarity may be performed to improve crystal orientation, and chemical resistance may be improved to secure manufacturing stability.

In detail, pure aluminum (Al) and an aluminum alloy (AlSc) containing scandium (Sc) were deposited on a seed layer of aluminum nitride (AlN) having a thickness of 500 Å, to a thickness of 1500 Å, and then, a surface defect was observed. As an observation result, a large amount of defects due to hillocks and grain boundary grooves are observed in the case of pure aluminum (Al), while in the case of aluminum alloy (AlSc) containing scandium (Sc), a defect due to hillocks and grain boundary grooves are significantly reduced.

Figure 6:
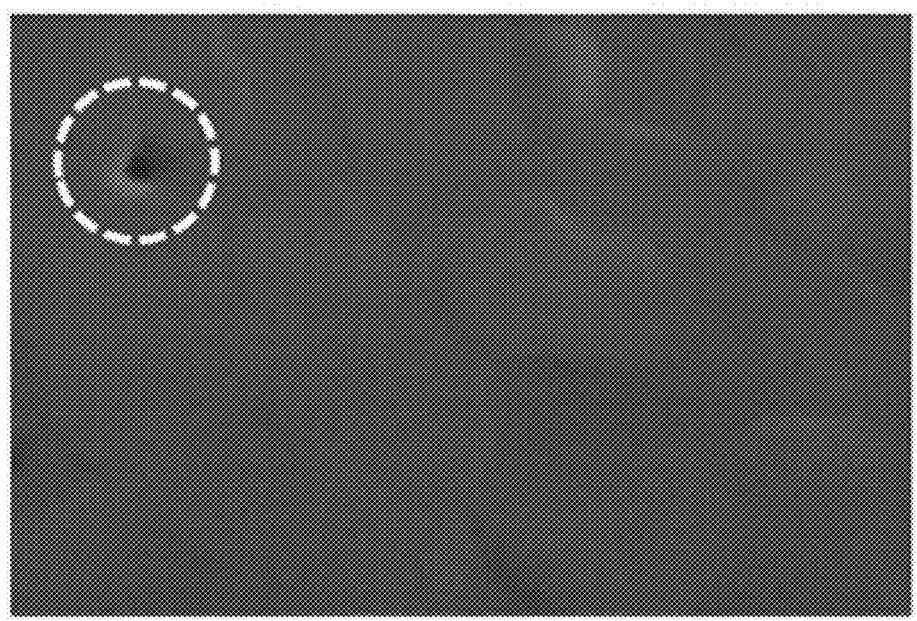
FIG. 6 is an image illustrating surface defects of pure aluminum.
Figure 7:
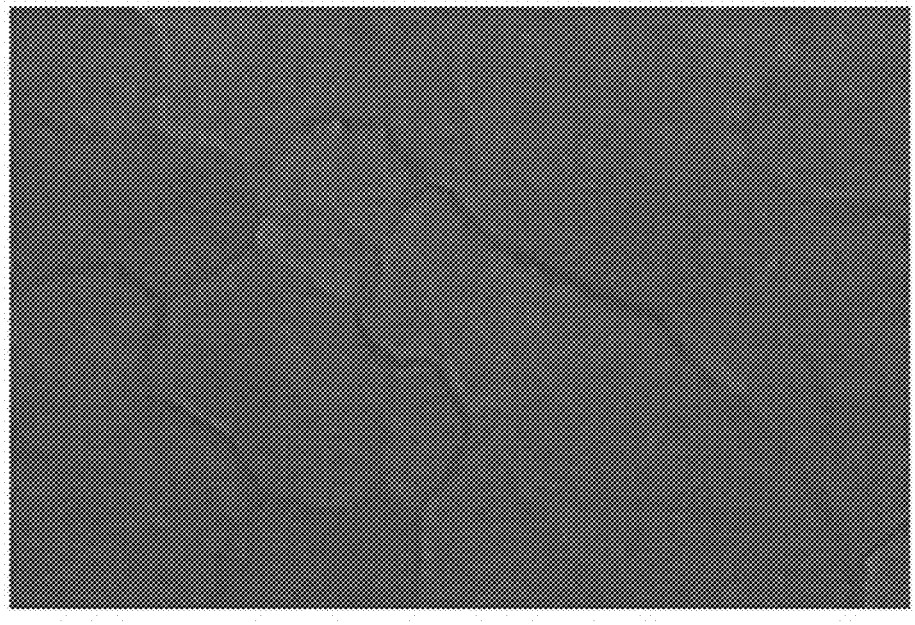
FIG. 7 is an image illustrating surface defects of a scandium-containing aluminum alloy (0.625 at %).
Figure 8:
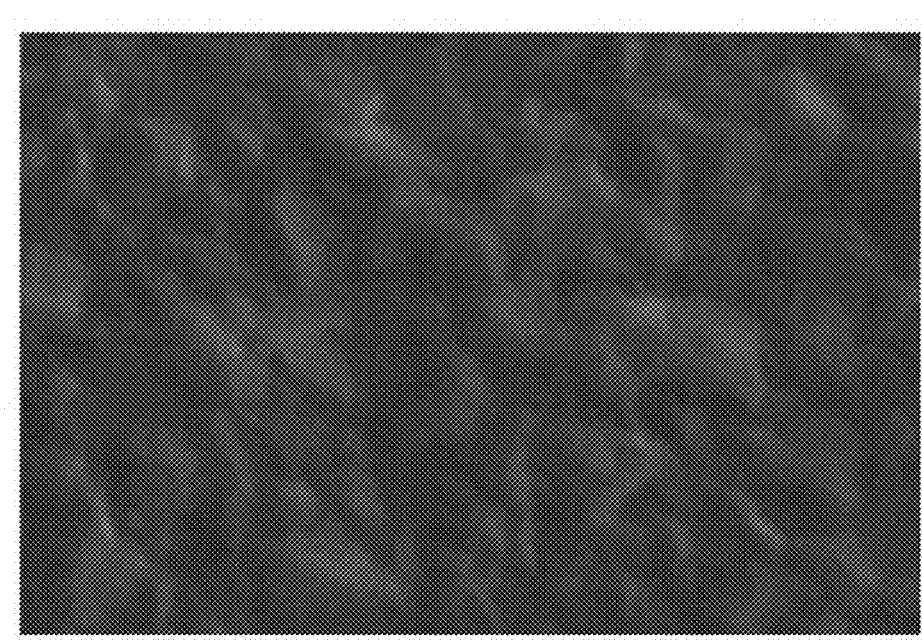
FIG. 8 is an image illustrating surface defects of a scandium-containing aluminum alloy (6.25 at %).

For example, as illustrated in FIGS. 6 to 8, in the case of pure aluminum (Al), surface defect such as a groove are observed, and in the case of aluminum alloy containing scandium (Sc) (AlSc, 0.625 at %), no surface defect is observed. In addition, it may be appreciated that if the content of scandium (Sc) is excessive, surface roughness may be significantly increased.

In more detail, surface roughness of samples obtained by depositing pure aluminum (Al), an aluminum alloy (AlSc) containing 0.625 at % of scandium (Sc), and an aluminum alloy (AlSc) containing 6.25 at % of scandium (Sc), was measured using an atomic force microscope (AFM). As illustrated in FIGS. 6 to 8, in the case of pure aluminum (Al), surface roughness Ra is 3.74 nm on the basis of a scan size of 10 um×10 um, and in the case of an aluminum alloy (AlSc) containing 0.625 at % of scandium (Sc), surface roughness (Ra) is 1.70 nm based on the scan size of 10 um×10 um. In addition, in the case of an aluminum alloy (AlSc) containing 6.25 at % of scandium (Sc), the surface roughness Ra increases to 10.27 nm on the basis of the scan size of 10 um×10 um.

On the other hand, pure aluminum (Al) and an aluminum alloy (AlSc) containing scandium (Sc) have a face centered cubic (FCC) crystal structure, and in the case of being oriented as a (111) crystal plane, lattice mismatch with (0002) crystal plane of an aluminum nitride (AlN) HCP crystal structure of the piezoelectric layer 160 is 8%, as an improved result in reduction of lattice mismatch, compared with a case of lattice mismatch of 14% in which the first electrode 150 is formed of molybdenum (Mo).

However, in the case of pure aluminum (Al), crystal orientation of the piezoelectric layer 160 is deteriorated in a case in which surface roughness is increased due to surface defects or the like.

In addition, pure aluminum (Al), aluminum alloy (AlSc) containing scandium (Sc), and molybdenum (Mo) were deposited to have a thickness of 1500 Å, on a seed layer, formed of aluminum nitride (AlN) and having a thickness of 500 Å, and then, an aluminum nitride (AlN) layer, the piezoelectric layer 160, was deposited to have a thickness of 5000 Å, and an XRD rocking curve is measured as illustrated in Table 2 to compare crystal orientation of thin films.

TABLE 2

| FWHM (degree) | Molybdenum (Mo) | Pure Aluminum (Al) | Scandium-containing aluminum alloy (AlSc 6.25 at %) | Scandium-containing aluminum alloy (AlSc 0.625 at %) |
|---|---|---|---|---|
| Crystal Orientation of First Electrode (1500 Å) | 2.77° (110) | 1.31° (111) | 1.13° (111) | 0.49° (111) |
| Crystal Orientation of Piezoelectric layer (5000 Å) | 1.95° (0002) | 1.73° (0002) | 2.19° (0002) | 0.78° (0002) |

For example, in a case in which aluminum nitride (AlN) is deposited on molybdenum (Mo), crystal orientation of aluminum nitride (AlN) is 1.95°, and in a case in which aluminum nitride (AlN) is deposited on pure aluminum, the crystal orientation is rather 1.73° due to surface defects of pure aluminum (Al). In other words, the crystal orientation of the piezoelectric layer is improved as compared with the case of applying molybdenum (Mo) thereto, but surface defects such as a groove, observed in the surface of pure aluminum (Al), is transferred as is, even in a case in which aluminum nitride (AlN) is deposited, as illustrated in FIG. 6. In addition, in the case of aluminum alloy (AlSc) containing 6.25 at % of scandium (Sc), crystal orientation is deteriorated as 2.19 degrees (see Table 2) at the time of depositing aluminum nitride (AlN) due to an increase in surface roughness, as illustrated in FIG. 7, as compared with the case of pure aluminum (Al). However, in the case of an aluminum alloy (AlSc) containing 0.625 at % of scandium (Sc), as illustrated in FIG. 8, when the aluminum nitride (AlN) is deposited, crystal orientation is 0.78 degree (see Table 2), a desirable degree of crystal orientation. For example, the piezoelectric layer 160 may be more stably deposited during a sputtering process, thereby improving crystal orientation and chemical resistance to secure manufacturing stability. The piezoelectric layer 160 is formed to cover at least the first electrode 150 formed on an upper portion of a cavity C. The piezoelectric layer 160 may be provided as a part causing a piezoelectric effect to convert electrical energy into mechanical energy in the form of acoustic waves, and may be formed of one of aluminum nitride (AlN), zinc oxide (ZnO), and lead zirconium titanium oxide (PZT; PbZrTiO). In detail, when the piezoelectric layer 160 is formed of aluminum nitride (AlN), the piezoelectric layer 160 may further include a rare earth metal. As an example, the rare earth metal may include at least one of scandium (Sc), erbium (Er), yttrium (Y), and lanthanum (La). Also, as an example, a transition metal may include at least one of titanium (Ti), zirconium (Zr), hafnium (Hf), tantalum (Ta), and niobium (Nb). Magnesium (Mg), a divalent metal, may also be included.

Figure 9:
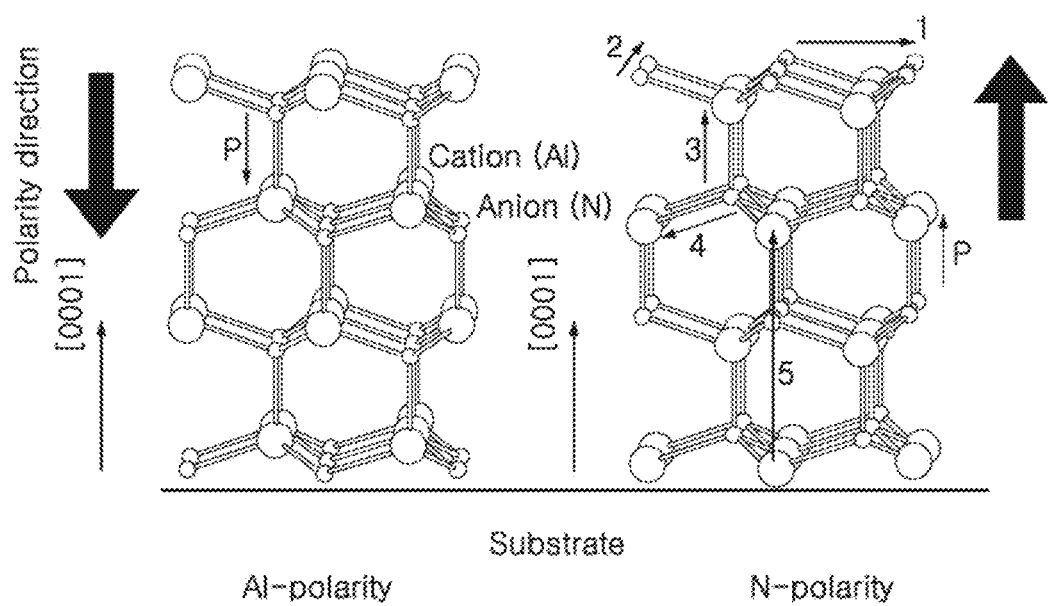
FIG. 9 is an explanatory diagram illustrating a cation (Al) polarity and an anion (N) polarity of a piezoelectric layer.

The piezoelectric layer 160 has a cation (Al) polarity as illustrated in FIG. 9. For example, since the first electrode 150 is formed of an aluminum alloy containing scandium (Sc), the piezoelectric layer 160 stacked on the first electrode 150 may have a cation (Al) polarity. Thus, the piezoelectric layer 160 may be formed in such a manner that a thickness of the piezoelectric layer 160 may be increased while crystal orientation of the piezoelectric layer 160 is sufficiently secured. In addition, a high frequency may be secured by further increasing the thickness of the piezoelectric layer 160.

In detail, in a case in which the first electrode 150 is formed using a conductive material such as molybdenum (Mo) or an alloy thereof, it may be relatively difficult to implement the cation (Al) polarity of the piezoelectric layer 160. For example, the cation (Al) polarity should be implemented by terminating the surface of a molybdenum (Mo) electrode with a hydrogen ($H_2$) treatment or by additionally depositing an aluminum seed layer on the molybdenum (Mo) electrode.

However, according to an example discussed herein, when the first electrode 150 includes aluminum, a cation (Al) polarity may be implemented without an electrode surface treatment or deposition of an additional seed layer. In addition, when the first electrode 150 includes aluminum, IL performance of a resonator may be improved due to a reduction in a specific resistance, as compared to the case in which the first electrode 150 is formed using a conductive material such as molybdenum (Mo) or an alloy thereof. Meanwhile, in a case in which the first electrode 150 is formed of pure aluminum, crystal orientation of the piezoelectric layer 160 may be deteriorated due to migration of particles.

When the first electrode 150 is formed of an aluminum alloy containing scandium, the piezoelectric layer 160 may be formed to have only a cation (Al) polarity. As described above, since the piezoelectric layer 160 is formed to have only the cation (Al) polarity, film quality loss of the piezoelectric layer may be reduced, compared with the case in which the piezoelectric layer 160 is formed to have only an anion (N) polarity.

In this case, the cation (Al) polarity and the anion (N) polarity will be described.

As illustrated in FIG. 9, the cation (Al) polarity refers to a case in which nitrogen (N) ions are first deposited on the first electrode 150 and aluminum (Al) ions are positioned in a central portion of a regular tetrahedron composed of Al—N, so that a polarity direction is a downward direction. The anion (N) polarity refers to a case in which aluminum (Al) ions are first deposited on the first electrode 150 and nitrogen (N) ions are positioned in a central portion of a regular tetrahedron composed of Al—N, so that the polarity direction is an upward direction.

The content of elements included in the aluminum nitride (AlN) to improve piezoelectric properties may be 0.1 to 30 at %. If the content of the elements included to improve piezoelectric properties is less than 0.1 at %, piezoelectric properties higher than that of aluminum nitride (AlN) may not be implemented. If the content of the elements included to improve piezoelectric properties exceeds 30 at %, it may be difficult to perform deposition and control a composition for deposition, and thus, a non-uniform phase may be formed. In addition, if the element content exceeds 30 at %, the probability of occurrence of abnormal grain growth sharply increases, so that serious surface defects may occur on the piezoelectric layer 160.

The piezoelectric layer 160 includes a piezoelectric portion 162 disposed on a flat portion S and a bent portion 164 disposed on an extended portion E.

The piezoelectric portion 162 is a portion directly stacked on an upper surface of the first electrode 150. Therefore, the piezoelectric portion 162 is interposed between the first electrode 150 and the second electrode 170, to be formed to have a flat shape, together with the first electrode 150 and the second electrode 170.

The bent portion 164 may be defined as a region extending outwardly from the piezoelectric portion 162 and located in the extended portion E.

The bent portion 164 is disposed on the insertion layer 180, and is formed in a protruding manner to conform to the shape of the insertion layer 180. Thus, the piezoelectric layer 160 is bent at a boundary between the piezoelectric portion 162 and the bent portion 164, and the bent portion 164 protrudes, corresponding to a thickness and a shape of the insertion layer 180.

The bent portion 164 may include an inclined portion 164a and an extended portion 164b.

The inclined portion 164a is a portion formed to be inclined along an inclined surface L of the insertion layer 180. The extended portion 164b is a portion extending outwardly from the inclined portion 164a.

The inclined portion 164a is formed parallel to the inclined surface L of the insertion layer 180, and an angle of inclination of the inclined portion 164a is formed to be equal to an angle of inclination ($\theta$ of FIG. 3) of the inclined surface L of the insertion layer 180.

The second electrode 170 is formed to cover at least the piezoelectric layer 160 disposed on an upper portion of the cavity C. The second electrode 170 may be used as either an input electrode or an output electrode for inputting and/or outputting an electrical signal such as a radio frequency (RF) signal. For example, when the first electrode 150 is used as an input electrode, the second electrode 170 may be used as an output electrode, and when the first electrode 150 is used as an output electrode, the second electrode 170 may be used as an input electrode.

The second electrode 170 may be formed of an aluminum alloy containing scandium (Sc), as in the case of the first electrode 150.

The second electrode 170 may be formed of an aluminum alloy (AlSc) containing only scandium (Sc). For example, no additional metal except scandium (Sc) is contained in the second electrode 170. If additional metals other than scandium (Sc) are contained, such an aluminum alloy forms a ternary phase diagram. In this case, it may be difficult to control a composition, and a complex phase system is caused, thereby causing the occurrence of compositional unevenness and an undesired crystal phase.

Further, when the second electrode 170 is formed of an aluminum alloy having a ternary system, surface roughness thereof may be increased due to an uneven composition and undesired crystal phase formation, which may adversely affect crystal orientation when the passivation layer 190 is formed.

Therefore, the second electrode 170 may be formed of an aluminum alloy (AlSc) containing only scandium (Sc), and thus, crystal orientation of the passivation layer 190 disposed on the second electrode 170 may be improved.

The insertion layer 180 is disposed between the first electrode 150 and the piezoelectric layer 160. The insertion layer 180 may be formed of a dielectric such as silicon oxide (SiO2), aluminum nitride (AlN), aluminum oxide (Al2O3), silicon nitride (Si3N4), manganese oxide (MgO), zirconium oxide (ZrO2), lead zirconate titanate (PZT), gallium arsenic (GaAs), hafnium oxide (HfO2), aluminum oxide (Al2O3), titanium oxide (TiO2), zinc oxide (ZnO), or the like, and is formed of a material different from that of the piezoelectric layer 160. Further, a region in which the insertion layer 180 is provided may also be provided as air, which may be implemented by removing the insertion layer 180 during a manufacturing process.

A thickness of the insertion layer 180 may be the same as or similar to that of the first electrode 150, and further, may be similar to or less than the piezoelectric layer 160. For example, the insertion layer 180 may be formed to have a thickness of 100 Å or more while being less than the thickness of the piezoelectric layer 160, but the configuration of the insertion layer 180 is not limited thereto.

The insertion layer 180 is disposed along a surface formed by the membrane layer 140, the first electrode 150 and the etch stop portion 130.

The insertion layer 180 is disposed around the flat portion S to support the bent portion 164 of the piezoelectric layer 160. The bent portion 164 of the piezoelectric layer 160 may be divided into the inclined portion 164a and the extended portion 164b conforming to a shape of the insertion layer 180.

The insertion layer 180 is disposed in an area excluding the flat portion S. For example, the insertion layer 180 may be disposed over the entire region except the flat portion S, or may be disposed in a portion thereof.

At least a portion of the insertion layer 180 is disposed between the piezoelectric layer 160 and the first electrode 150.

A side surface of the insertion layer 180 disposed along a boundary of the flat portion S is formed to have a thickness that increases away from the flat portion S. Thus, the insertion layer 180 is formed to have the inclined surface L by which a side surface of the insertion layer adjacent to the flat portion S has a predetermined angle of inclination ($\theta$).

If the angle of inclination ($\theta$) of the side surface of the insertion layer 180 is less than 5 degrees, a thickness of the insertion layer 180 should be significantly reduced, or an area of the inclined surface L should be excessively large, which are actually difficult to be implemented.

If the angle of inclination ($\theta$) of the side surface of the insertion layer 180 is formed greater than 70 degrees, an angle of inclination of the inclined portion 164a of the piezoelectric layer 160 stacked on the insertion layer 180 is formed to be greater than 70 degrees. In this case, since the piezoelectric layer 160 is excessively bent, a crack may occur in the bent portion 164 of the piezoelectric layer 160.

Therefore, in the example, the angle of inclination ($\theta$) of the inclined surface L is formed in a range of 5 degrees or more and 70 degrees or less.

The passivation layer 190 is formed in a region except for portions of the first electrode 150 and the second electrode 170. The passivation layer 190 prevents damage of the second electrode 170 and the first electrode 150 during a process.

Further, the passivation layer 190 may be partially removed by etching for frequency control in a final process. For example, a thickness of the passivation layer 190 may be adjusted. As the passivation layer 190, in an example, a dielectric layer including one of silicon nitride (Si3N4), silicon oxide (SiO2), manganese oxide (MgO), zirconium oxide (ZrO2), aluminum nitride (AlN), lead zirconate titanate (PZT), gallium arsenic (GaAs), hafnium oxide (HfO2), aluminum oxide (Al2O3), titanium oxide (TiO2), and zinc oxide (ZnO) may be used.

The metal pad 195 is formed on portions of the first electrode 150 and the second electrode 170, in which the passivation layer 190 is not formed. As an example, the metal pad 195 may be formed of a material such as gold (Au), a gold-tin (Au—Sn) alloy, copper (Cu), a copper-tin (Cu—Sn) alloy, aluminum (aluminum), an aluminum alloy, or the like. For example, the aluminum alloy may be an aluminum-germanium (Al—Ge) alloy.

Since the piezoelectric layer 160 is formed on the first electrode 150 formed of an aluminum alloy containing scandium (Sc), the piezoelectric layer 160 may have a cation (Al) polarity.

Thus, the thickness of the piezoelectric layer 160 may be increased while crystal orientation of the piezoelectric layer 160 is sufficiently secured. In addition, a high frequency may be implemented by increasing a thickness of the piezoelectric layer 160.

In detail, in a case in which the first electrode 150 is formed using a conductive material such as molybdenum (Mo) or an alloy thereof, it may be relatively difficult to implement the cation (Al) polarity of the piezoelectric layer 160. For example, the cation (Al) polarity should be implemented by terminating the surface of a molybdenum (Mo) electrode with hydrogen ($H_2$) treatment or by additionally depositing an aluminum seed layer on the molybdenum (Mo) electrode.

However, according to an example discussed herein, when the first electrode 150 includes aluminum, a cation (Al) polarity may be implemented without an electrode surface treatment or deposition of an additional seed layer. In addition, when the first electrode 150 includes aluminum, IL performance of a resonator may be improved due to a reduction in a specific resistance, as compared to the case in which the first electrode 150 is formed using a conductive material such as molybdenum (Mo) or an alloy thereof. Meanwhile, in a case in which the first electrode 150 is formed of pure aluminum, crystal orientation of the piezoelectric layer 160 is deteriorated due to migration of particles.

When the first electrode 150 is formed of an aluminum alloy containing scandium, the piezoelectric layer 160 may be formed to have only a cation (Al) polarity. Since the piezoelectric layer 160 is formed to have only the cation (Al) polarity, film quality loss of the piezoelectric layer may be reduced, compared with the case in which the piezoelectric layer 160 is formed to have only an anion (N) polarity.

Figure 10:
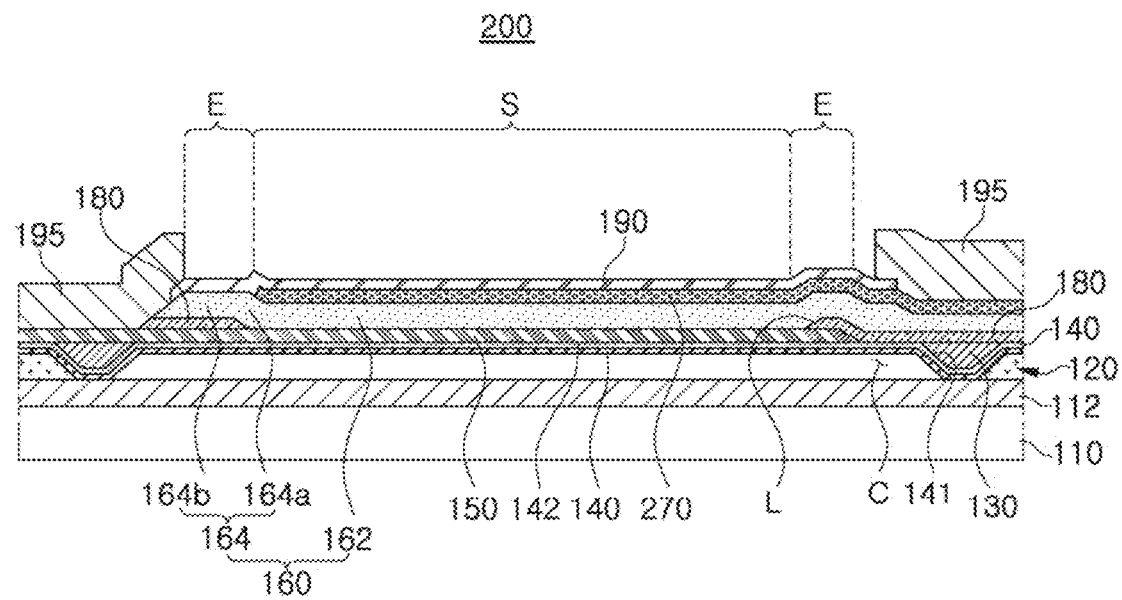
FIG. 10 is a schematic cross-sectional view illustrating a bulk acoustic wave resonator according to an example.

FIG. 10 is a schematic cross-sectional view illustrating a bulk acoustic wave resonator according to an example.

Referring to FIG. 10, a bulk acoustic wave resonator 200 may include a substrate 110, a sacrificial layer 120, an etch stop portion 130, a membrane layer 140, a first electrode 150, a piezoelectric layer 160, a second electrode 270, an insertion layer 180, a passivation layer 190, and a metal pad 195.

The substrate 110, the sacrificial layer 120, the etch stop portion 130, the membrane layer 140, the first electrode 150, the piezoelectric layer 160, the insertion layer 180, the passivation layer 190, and the metal pad 195 are substantially the same as the configurations of the bulk acoustic wave resonator 100 described above, and thus, a detailed description thereof will be omitted by being substituted with the above description.

The second electrode 270 may be formed using a conductive material such as molybdenum (Mo) or an alloy thereof, but a configuration of the second electrode 270 is not limited thereto. For example, the second electrode 270 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys thereof.

The second electrode 270 is formed to cover at least the piezoelectric layer 160 disposed on an upper portion of a cavity C. The second electrode 270 may be used as either an input electrode or an output electrode for inputting and/or outputting an electrical signal such as a radio frequency (RF) signal. For example, when the first electrode 150 is used as an input electrode, the second electrode 270 may be used as an output electrode, and when the first electrode 150 is used as an output electrode, the second electrode 270 may be used as an input electrode.

Figure 11:
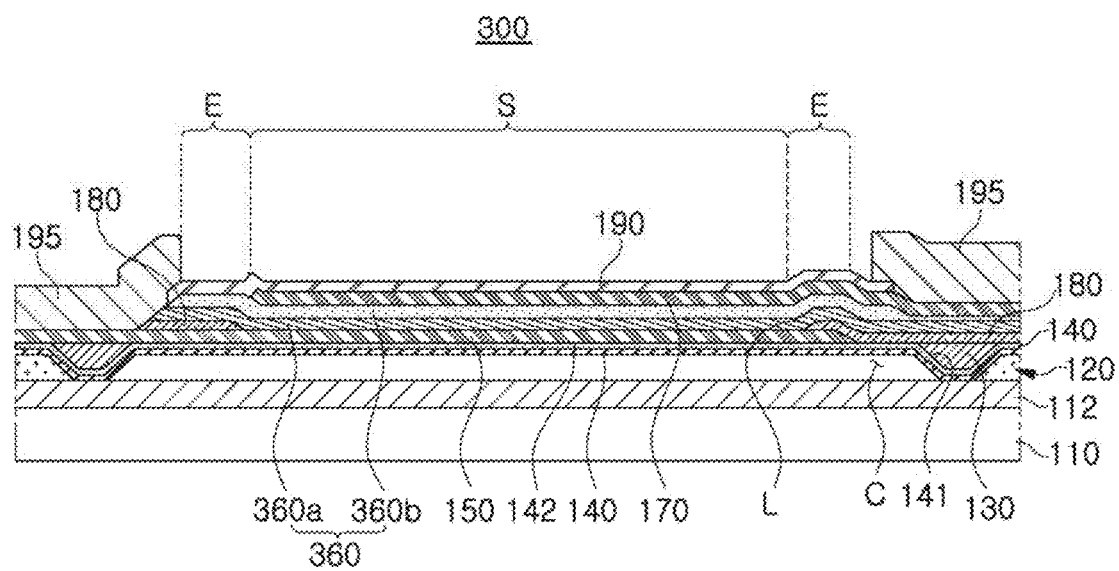
FIG. 11 is a schematic cross-sectional view illustrating a bulk acoustic wave resonator according to an example.

FIG. 11 is a schematic cross-sectional view illustrating a bulk acoustic wave resonator according to an example.

Referring to FIG. 11, a bulk acoustic wave resonator 300 includes a substrate 110, a sacrificial layer 120, an etch stop portion 130, a membrane layer 140, a first electrode 150, a piezoelectric layer 360, a second electrode 170, an insertion layer 180, a passivation layer 190, and a metal pad 195.

The substrate 110, the sacrificial layer 120, the etch stop portion 130, the membrane layer 140, the first electrode 150, the second electrode 170, the insertion layer 180, the passivation layer 190 and the metal pad 195 are substantially the same as the configurations of the bulk acoustic wave resonator 100 described above, and thus, a detailed description thereof will be omitted by being substituted with the above description.

The piezoelectric layer 360 is formed to cover at least the first electrode 150 disposed on the upper portion of the cavity C. The piezoelectric layer 360 is formed of one of aluminum nitride (AlN), zinc oxide (ZnO) and lead zirconium titanium oxide (PZT; PbZrTiO), as a part causing a piezoelectric effect to convert electrical energy into mechanical energy in the form of acoustic waves. When the piezoelectric layer 360 is formed of aluminum nitride (AlN), the piezoelectric layer 360 may further include a rare earth metal. As an example, the rare earth metal may include at least one of scandium (Sc), erbium (Er), yttrium (Y), and lanthanum (La). Also, as an example, a transition metal may include at least one of titanium (Ti), zirconium (Zr), hafnium (Hf), tantalum (Ta), and niobium (Nb). Further, magnesium (Mg), a divalent metal, may also be included therein.

The piezoelectric layer 360 includes a first piezoelectric layer 360a formed on the first electrode 150 and having a cation (Al) polarity (see FIG. 9), and a second piezoelectric layer 360b formed on the first piezoelectric layer 360a and having an anion (N) polarity (see FIG. 9). As such, the first and second piezoelectric layers 360a and 360b are stacked in such a manner that polarities of the first and second piezoelectric layers 360a and 360b are in opposite directions to each other, and thus, resonance may be generated at twice a fundamental resonance. Therefore, a high frequency may be implemented while having a thickness of the piezoelectric layer 360 enough to secure film quality. For example, $Kt^2$ performance may be controlled without deteriorating film quality and without deteriorating other performance.

The second piezoelectric layer 360b may have an anion (N) polarity by being deposited with a mixed gas containing oxygen during lamination. For example, an oxygen element may be contained at an interface between the first piezoelectric layer 360a and the second piezoelectric layer 360b.

When the piezoelectric layer 360 is comprised of the first piezoelectric layer 360a having a cation (Al) polarity and the second piezoelectric layer 360b having an anion (N) polarity, $Kt^2$ may be controlled by adjusting a thickness ratio of the first and second piezoelectric layers 360a and 360b. $Kt^2$ may be varied to a lower value to implement a narrow band width.

For example, in a case in which the piezoelectric layer has only an anion (N) polarity, a $Kt^2$ variation range may be implemented as 6-7%, but when the first piezoelectric layer 360a having a cation (Al) polarity and the second piezoelectric layer 360b having an anion (N) polarity are variously changed in thickness ratios, various $Kt^2$ may be implemented at one frequency as illustrated in Table 3 below.

TABLE 3

| Examples | Ratio of First Piezoelectric Layer Thickness (%) to Total Piezoelectric Layer Thickness | Ratio of Second Piezoelectric Layer Thickness (%) to Total Piezoelectric Layer Thickness | Thickness Ratio (Thickness of First Piezoelectric Layer/ Thickness of Second Piezoelectric Layer) | $Kt^2$ Variation range (%) |
|---|---|---|---|---|
| 1 | 100 | 0 | — | 7.01 |
| 2 | 91 | 9 | 10.11 | 5.83 |
| 3 | 84 | 16 | 5.25 | 4.92 |
| 4 | 79 | 21 | 3.76 | 4.27 |
| 5 | 70 | 30 | 2.33 | 3.10 |
| 6 | 62 | 38 | 1.63 | 2.06 |
| 7 | 58 | 42 | 1.38 | 1.54 |
| 8 | 40 | 60 | 0.67 | 1.69 |
| 9 | 37 | 63 | 0.59 | 2.01 |
| 10 | 25 | 75 | 0.33 | 3.32 |
| 11 | 10 | 90 | 0.11 | 4.49 |
| 12 | 4 | 96 | 0.04 | 5.59 |
| 13 | 0 | 100 | — | 6.03 |

Figure 12:
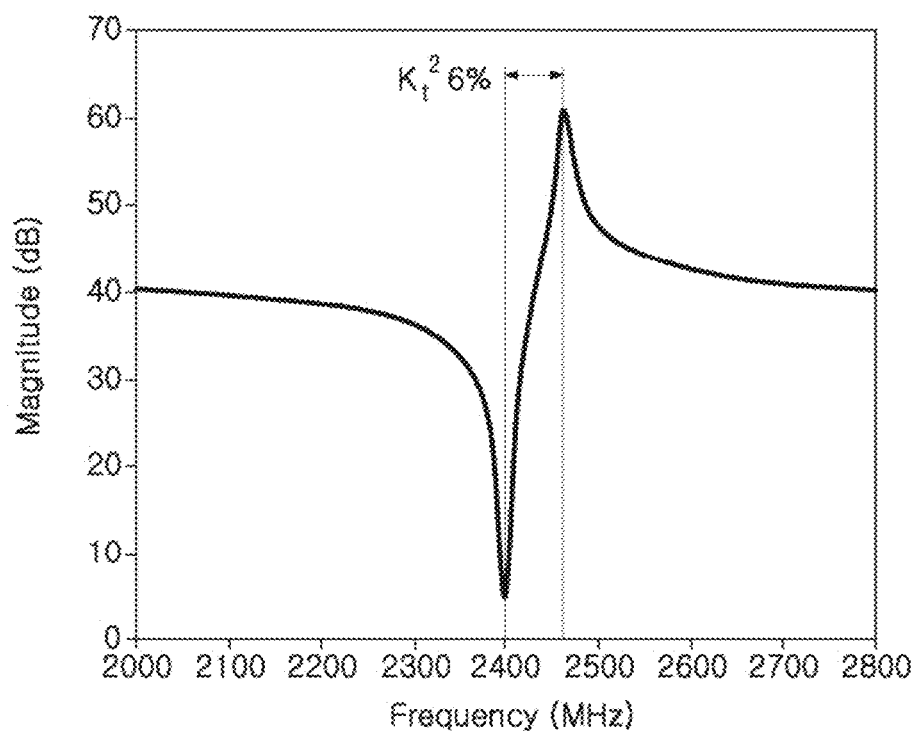
FIGS. 12 and 13 are graphs illustrating the result of adjusting $Kt^2$ depending on a polarity thickness ratio.
Figure 13:
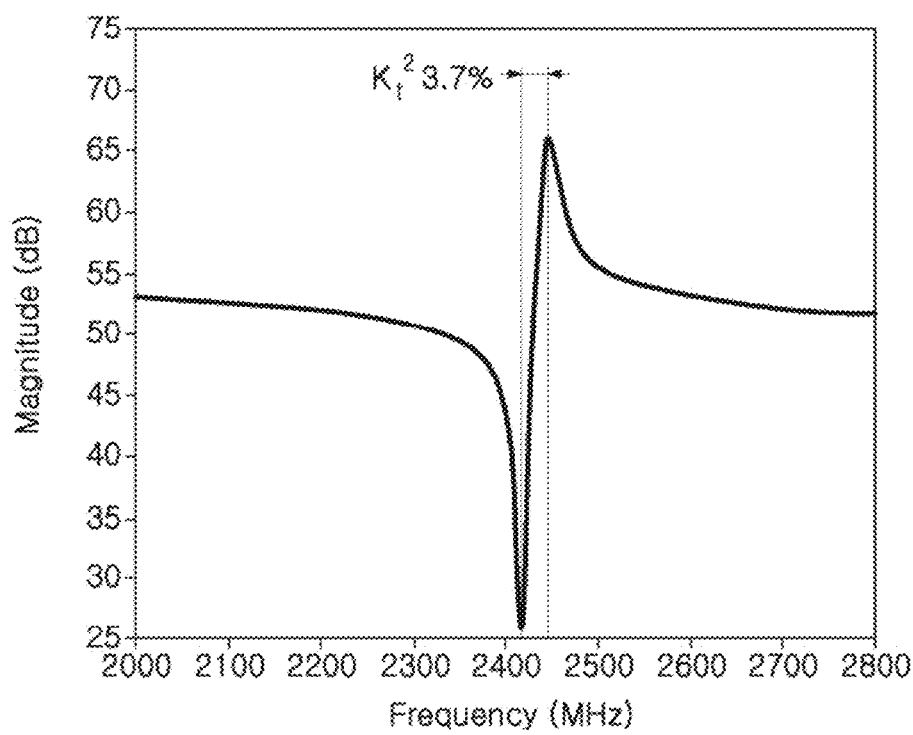

FIGS. 12 and 13 are graphs illustrating the results of adjusting $Kt^2$ depending on a polarity thickness ratio in a 2.4 GHz frequency band, in Examples 13 and 10 of Table 3 above.

On the other hand, B30 (band 30, international standard), which uses a narrow band width, requires 2 to 5% band of $Kt^2$. If $Kt^2$ is 2% or less, it may be difficult to implement the band width, and even if the $Kt^2$ is implemented, the band width is considerably narrow and thus, insertion loss increases. If the $Kt^2$ is 5% or more, it may be difficult to implement a narrow band width since the band width is relatively too wide. Therefore, in the case of a narrow band in which a band width of 2 to 5% of $Kt^2$ is required, a thickness ratio of the first piezoelectric layer 360a/the second piezoelectric layer 360b may be 1.63 to 5.25 or 0.11 to 0.59.

Figure 14:
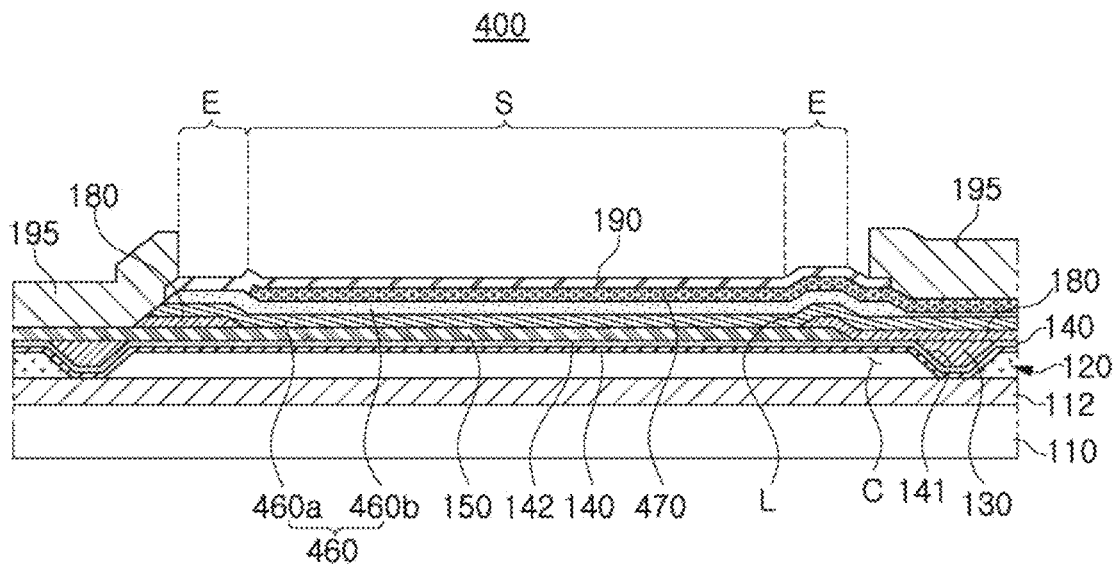
FIG. 14 is a schematic cross-sectional view illustrating a bulk acoustic wave resonator according to an example.

FIG. 14 is a schematic cross-sectional view illustrating a bulk acoustic wave resonator according to example.

Referring to FIG. 14, a bulk acoustic wave resonator 400 may include a substrate 110, a sacrificial layer 120, an etch stop portion 130, a membrane layer 140, a first electrode 150, a piezoelectric layer 460, a second electrode 470, an insertion layer 180, a passivation layer 190, and a metal pad 195.

The substrate 110, the sacrificial layer 120, the etch stop portion 130, the membrane layer 140, the first electrode 150, the insertion layer 180, the passivation layer 190, and the metal pad 195 are substantially the same as the configurations of the bulk acoustic wave resonator 100 described above. Thus, a detailed description thereof will be omitted by being substituted with the above description.

The piezoelectric layer 460 is formed to cover at least the first electrode 150 disposed on an upper portion of a cavity C. The piezoelectric layer 460 is formed of one of aluminum nitride (AlN), zinc oxide (ZnO) and lead zirconium titanium oxide (PZT; PbZrTiO), which is a part causing a piezoelectric effect to convert electrical energy into mechanical energy in the form of acoustic waves. When the piezoelectric layer 460 is composed of aluminum nitride (AlN), the piezoelectric layer 460 may further include a rare earth metal. As an example, the rare earth metal may include at least one of scandium (Sc), erbium (Er), yttrium (Y), and lanthanum (La). Also, as an example, a transition metal may include at least one of titanium (Ti), zirconium (Zr), hafnium (Hf), tantalum (Ta), and niobium (Nb). Magnesium (Mg), which is a divalent metal, may also be included.

The piezoelectric layer 460 includes a first piezoelectric layer 460a formed on the first electrode 150 and having a cation (Al) polarity (see FIG. 9), and a second piezoelectric layer 460b formed on the first piezoelectric layer 460a and having an anion (N) polarity (see FIG. 9). As such, the first and second piezoelectric layers 460a and 460b are stacked in such a manner that polarities of the first and second piezoelectric layers 360a and 360b are in opposite directions to each other, and thus, resonance may be generated at twice a fundamental resonance. Therefore, a high frequency may be implemented while having a thickness of the piezoelectric layer 460 enough to secure film quality.

For example, $Kt^2$ performance may be controlled without deteriorating film quality and without deteriorating other performance.

The second piezoelectric layer 460b may have an anion (N) polarity by being deposited with a mixed gas containing oxygen during lamination.

When the piezoelectric layer 460 is comprised of the first piezoelectric layer 460a having a cation (Al) polarity and the second piezoelectric layer 460b having an anion (N) polarity, $Kt^2$ may be controlled by adjusting a thickness ratio of the first and second piezoelectric layers 460a and 460b. $Kt^2$ may be varied to a lower value to implement a narrow band width.

For example, in a case in which the piezoelectric layer has only an anion (N) polarity, a $Kt^2$ variation range may be implemented as 6 to 7%, but when the first piezoelectric layer 460a having a cation (Al) polarity and the second piezoelectric layer 460b having an anion (N) polarity are variously changed in thickness ratios, various $Kt^2$ may be implemented at one frequency as illustrated in Table 3.

On the other hand, B30 (band 30, international standard), which uses a narrow band width, requires 2 to 5% band of $Kt^2$. If $Kt^2$ is 2% or less, it may be difficult to implement the band width, and even if the $Kt^2$ is implemented, the band width is considerably narrow, and thus, insertion loss increases. In addition, if the $Kt^2$ is 5% or more, it may be difficult to implement a narrow band width since the band width is relatively too wide. Therefore, in the case of a narrow band in which a band width of 2 to 5% of $Kt^2$ is required, a thickness ratio of the first piezoelectric layer 460a/the second piezoelectric layer 460b may be 1.63 to 5.25 or 0.11 to 0.59.

The second electrode 470 may be formed using a conductive material such as molybdenum (Mo) or an alloy thereof, but a configuration of the second electrode 470 is not limited thereto. For example, the second electrode 470 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or may be formed of alloys thereof.

The second electrode 470 is formed to cover at least the piezoelectric layer 460 disposed on the upper portion of the cavity C. The second electrode 470 may be used as either an input electrode or an output electrode for inputting and/or outputting an electrical signal such as a radio frequency (RF) signal. For example, when the first electrode 150 is used as an input electrode, the second electrode 470 may be used as an output electrode, and when the first electrode 150 is used as an output electrode, the second electrode 470 may be used as an input electrode.

Figure 15:
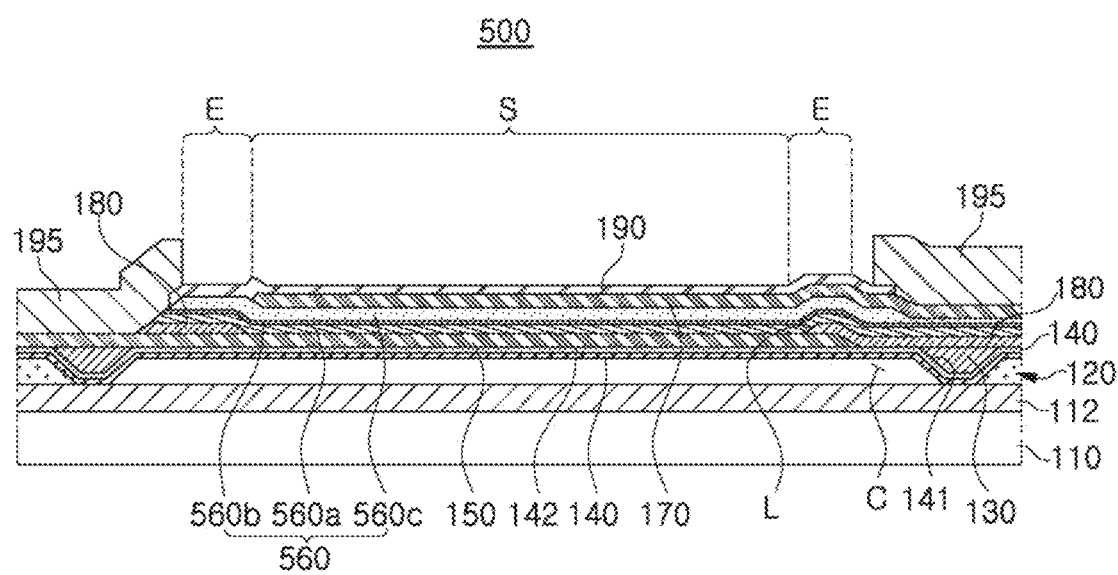
FIG. 15 is a schematic cross-sectional view illustrating a bulk acoustic wave resonator according to an example.

FIG. 15 is a schematic cross-sectional view illustrating a bulk acoustic wave resonator according to an example.

Referring to FIG. 15, a bulk acoustic wave resonator 500 may include a substrate 110, a sacrificial layer 120, an etch stop portion 130, a membrane layer 140, a first electrode 150, a piezoelectric layer 560, a second electrode 170, an insertion layer 180, a passivation layer 190, and a metal pad 195.

The substrate 110, the sacrificial layer 120, the etch stop portion 130, the membrane layer 140, the first electrode 150, the second electrode 170, the insertion layer 180, the passivation layer 190 and the metal pad 195 are substantially the same as the configurations of the bulk acoustic wave resonator 100 described above. Thus, a detailed description thereof will be omitted by being substituted with the above description.

The piezoelectric layer 560 is formed to cover at least the first electrode 150 disposed on the upper portion of the cavity C. The piezoelectric layer 560 is formed of one of aluminum nitride (AlN), zinc oxide (ZnO) and lead zirconium titanium oxide (PZT; PbZrTiO), which is a part causing a piezoelectric effect to convert electrical energy into mechanical energy in the form of acoustic waves. When the piezoelectric layer 560 is composed of aluminum nitride (AlN), the piezoelectric layer 560 may further include a rare earth metal. As an example, the rare earth metal may include at least one of scandium (Sc), erbium (Er), yttrium (Y), and lanthanum (La). Also, as an example, a transition metal may include at least one of titanium (Ti), zirconium (Zr), hafnium (Hf), tantalum (Ta), and niobium (Nb). Magnesium (Mg), which is a divalent metal, may also be included therein.

The piezoelectric layer 560 may include a first piezoelectric layer 560a formed on the first electrode 150 and having a cation (Al) polarity (see FIG. 9), an oxide layer 560b formed on the first piezoelectric layer 560a, and a second piezoelectric layer 560c formed on the oxide layer 560b and having an anion (N) polarity (see FIG. 9). As such, the first and second piezoelectric layers 560a and 560c are stacked in such a manner that polarities of the first and second piezoelectric layers 560a and 560c are in opposite directions to each other, and thus, resonance may be generated at twice the fundamental resonance. Therefore, a high frequency may be implemented while having a thickness of the piezoelectric layer 560 enough to secure film quality. For example, $Kt^2$ performance may be controlled without deteriorating film quality and without deteriorating other performance.

On the other hand, the second piezoelectric layer 560c is formed on the oxide layer 560b, and thus, may be formed to have an anion (N) polarity.

When the piezoelectric layer 560 is comprised of the first piezoelectric layer 560a having a cation (Al) polarity and the second piezoelectric layer 560c having an anion (N) polarity, $Kt^2$ may be controlled by adjusting a thickness ratio of the first and second piezoelectric layers 560a and 560c. $Kt^2$ may be varied to a lower value to implement a narrow band width.

For example, in a case in which the piezoelectric layer has only an anion (N) polarity, a $Kt^2$ variation range may be implemented as 6 to 7%, but when the first piezoelectric layer 560a having a cation (Al) polarity and the second piezoelectric layer 560c having an anion (N) polarity are variously changed in thickness ratios, various $Kt^2$ may be implemented at one frequency.

Figure 16:
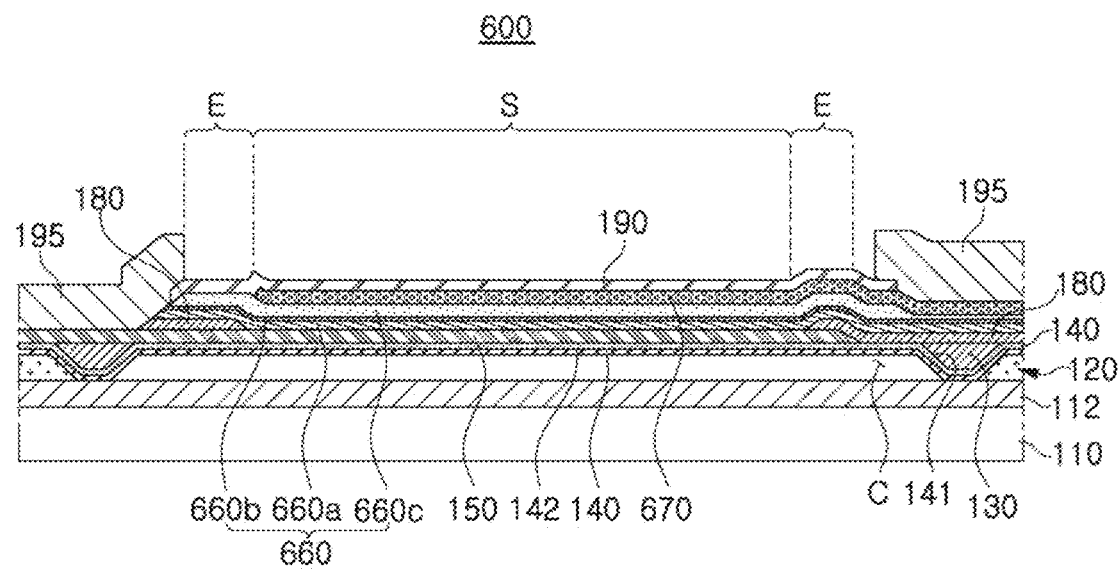
FIG. 16 is a schematic cross-sectional view illustrating a bulk acoustic wave resonator according to an example.

FIG. 16 is a schematic cross-sectional view illustrating a bulk acoustic wave resonator according an example.

Referring to FIG. 16, a bulk acoustic wave resonator 600 may include a substrate 110, a sacrificial layer 120, an etch stop portion 130, a membrane layer 140, a first electrode 150, a piezoelectric layer 660, a second electrode 670, an insertion layer 180, a passivation layer 190, and a metal pad 195.

The substrate 110, the sacrificial layer 120, the etch stop portion 130, the membrane layer 140, the first electrode 150, the insertion layer 180, the passivation layer 190, and the metal pad 195 are substantially the same as the configurations of the bulk acoustic wave resonator 100 described above. Thus, a detailed description thereof will be omitted by being substituted with the above description.

The piezoelectric layer 660 is formed to cover at least the first electrode 150 disposed on an upper portion of a cavity C. The piezoelectric layer 660 is formed of one of aluminum nitride (AlN), zinc oxide (ZnO), and lead zirconium titanium oxide (PZT; PbZrTiO), which is a part causing a piezoelectric effect to convert electrical energy into mechanical energy in the form of acoustic waves. When the piezoelectric layer 660 is composed of aluminum nitride (AlN), the piezoelectric layer 660 may further include a rare earth metal. As an example, the rare earth metal may include at least one of scandium (Sc), erbium (Er), yttrium (Y), and lanthanum (La). Also, as an example, a transition metal may include at least one of titanium (Ti), zirconium (Zr), hafnium (Hf), tantalum (Ta), and niobium (Nb). Magnesium (Mg), which is a divalent metal, may also be included therein.

The piezoelectric layer 660 includes a first piezoelectric layer 660a formed on the first electrode 150 and having a cation (Al) polarity (see FIG. 9), an oxide layer 660b formed on the first piezoelectric layer 660a, and a second piezoelectric layer 660c formed on the oxide layer 660b and having an anion (N) polarity (see FIG. 9). As such, the first and second piezoelectric layers 660a and 660c are stacked in such a manner that polarities of the first and second piezoelectric layers 660a and 660c are in opposite directions to each other, and thus, resonance may be generated at twice a fundamental resonance. Therefore, a high frequency may be implemented while having a thickness of the piezoelectric layer 660 enough to secure film quality. For example, $Kt^2$ performance may be controlled without deteriorating film quality and without deteriorating other performance.

The second piezoelectric layer 660c is formed on the oxide layer 660b, and thus, may be formed to have an anion (N) polarity.

When the piezoelectric layer 660 is formed of the first piezoelectric layer 660a having a cation (Al) polarity and the second piezoelectric layer 660c having an anion (N) polarity, $Kt^2$ may be controlled by adjusting a thickness ratio of the first and second piezoelectric layers 660a and 660c. As such, $Kt^2$ may be varied to a lower value to implement a narrow band width.

For example, in a case in which the piezoelectric layer has only an anion (N) polarity, a $Kt^2$ variation range may be implemented as 6%, but when a thickness ratio of the first piezoelectric layer 660a having a cation (Al) polarity and the second piezoelectric layer 660c having an anion (N) polarity is 1:1, a variation range of $Kt^2$ may be implemented as 0%. Further, when the thickness ratio of the first piezoelectric layer 660a having the cation (Al) polarity and the second piezoelectric layer 660c having the anion (N) polarity is 1:2, a variation of $Kt^2$ may be implemented as 2%.

The second electrode 670 may be formed using a conductive material such as molybdenum (Mo) or an alloy thereof, but a configuration of the second electrode 670 is not limited thereto. The second electrode 670 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or may be formed of alloys thereof.

On the other hand, the second electrode 670 is formed to cover at least the piezoelectric layer 660 disposed on the upper portion of the cavity C. The second electrode 670 may be used as either an input electrode or an output electrode for inputting and/or outputting an electrical signal such as a radio frequency (RF) signal. For example, when the first electrode 150 is used as an input electrode, the second electrode 670 may be used as an output electrode, and when the first electrode 150 is used as an output electrode, the second electrode 670 may be used as an input electrode.

Figure 17:
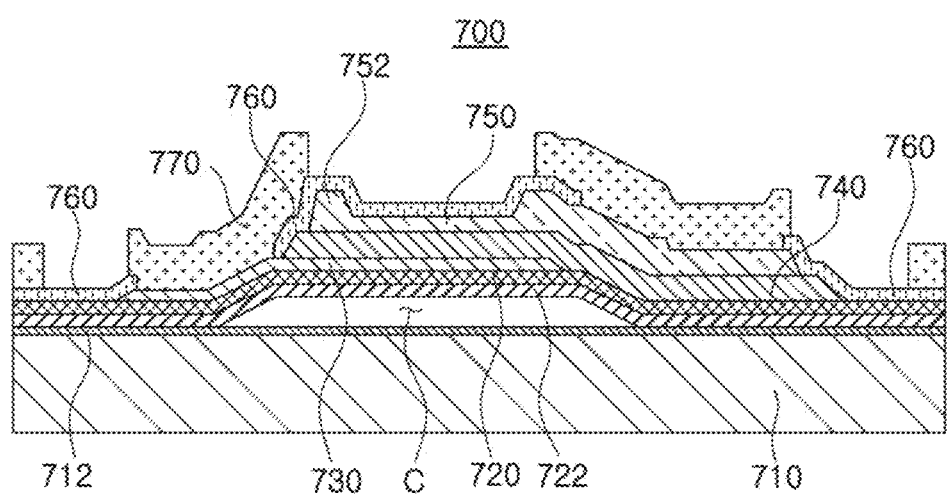
FIG. 17 is a schematic cross-sectional view illustrating a bulk acoustic wave resonator according to an example.

FIG. 17 is a schematic cross-sectional view illustrating a bulk acoustic wave resonator according to an example.

Referring to FIG. 17, a bulk acoustic wave resonator 700 includes a substrate 710, a membrane layer 720, a first electrode 730, a piezoelectric layer 740, a second electrode 750, a passivation layer 760, and a metal pad 770, as an example.

The substrate 710 may be a substrate on which silicon is stacked. For example, a silicon wafer may be used as the substrate 710. The substrate 710 may be provided with a substrate protective layer 712 disposed to face a cavity C.

The substrate protective layer 712 serves to prevent the substrate 710 from being damaged when the cavity C is formed.

As an example, the substrate protective layer 712 may be formed of at least one of silicon dioxide (SiO2), silicon nitride (Si3N4), aluminum oxide (Al2O2), and aluminum nitride (AlN), and may be formed using one of chemical vapor deposition, RF magnetron sputtering, and evaporation.

The membrane layer 720 is formed on an upper portion of a sacrificial layer (not illustrated) to be finally removed, and the membrane layer 720 forms the cavity C together with the substrate protective layer 712 by removing the sacrificial layer. For example, a sacrificial layer is formed on the substrate 710, to form the cavity C, and then the cavity C is formed by removing the sacrificial layer. As the membrane layer 720, a dielectric layer including one of silicon nitride (Si3N4), silicon oxide (SiO2), manganese oxide (MgO), zirconium oxide (ZrO2), aluminum nitride (AlN), lead zirconate titanate (PZT), gallium arsenic (GaAs), hafnium oxide (HfO2), aluminum oxide (Al2O3), titanium oxide (TiO2), and zinc oxide (ZnO) may be used.

A seed layer 722 formed of aluminum nitride (AlN) may be formed on the membrane layer 720. For example, the seed layer 722 may be disposed between the membrane layer 720 and the first electrode 730. The seed layer 722 may be formed using a dielectric or metal having an HCP crystal structure in addition to aluminum nitride (AlN). As an example, when the seed layer 722 is a metal layer, the seed layer 722 may be formed of titanium (Ti).

The first electrode 730 is formed on the seed layer 722 of the membrane layer 720. Also, the first electrode 730 may be used as either an input electrode or an output electrode for inputting and/or outputting an electrical signal such as a radio frequency (RF) signal.

The first electrode 730 may be formed of an aluminum alloy containing scandium (Sc) as an example. As described above, since the first electrode 730 is formed of an aluminum alloy containing scandium (Sc), mechanical strength may be increased and high power reactive sputtering may be performed. Surface roughness of the first electrode 730 may be prevented from increasing and the high orientation growth of the piezoelectric layer 740 may be induced under such deposition conditions.

Since scandium (Sc) is present, chemical resistance of the first electrode 730 is increased, and a disadvantage that occurs in a case in which the first electrode is formed of pure aluminum may be compensated. Further, process stability such as dry etching or wet processing may be secured in manufacturing. Further, in a case in which the first electrode is formed of pure aluminum, oxidation is easily caused. However, since the first electrode 730 is formed of an aluminum alloy containing scandium, the chemical resistance to oxidation may be improved.

Further, since the first electrode 730 is formed of an aluminum alloy (AlSc) containing only scandium (Sc), the polarity of the piezoelectric layer 740 disposed on an upper portion of the first electrode 730 may have a cation (Al) polarity (see FIG. 10).

The piezoelectric layer 740 is formed to cover at least a portion of the first electrode 730. The piezoelectric layer 740 may be formed of one of aluminum nitride (AlN), zinc oxide (ZnO), and lead zirconium titanium oxide (PZT; PbZrTiO), as a part causing a piezoelectric effect to convert electrical energy into mechanical energy in the form of acoustic waves. When the piezoelectric layer 740 is formed of aluminum nitride (AlN), the piezoelectric layer 740 may further include a rare earth metal. As an example, the rare earth metal may include at least one of scandium (Sc), erbium (Er), yttrium (Y), and lanthanum (La). Also, as an example, a transition metal may include at least one of titanium (Ti), zirconium (Zr), hafnium (Hf), tantalum (Ta), and niobium (Nb). Magnesium (Mg), a divalent metal, may also be included therein.

Also, the piezoelectric layer 740 has a cation (Al) polarity (see FIG. 9). For example, since the first electrode 730 is formed of an aluminum alloy containing scandium (Sc), the piezoelectric layer 740 stacked on the first electrode 730 may have a cation (Al) polarity. Thus, the piezoelectric layer 740 may be formed in such a manner that a thickness of the piezoelectric layer 740 may be increased while crystal orientation of the piezoelectric layer 740 is sufficiently secured. In addition, a high frequency may be secured by further increasing the thickness of the piezoelectric layer 740.

The second electrode 750 is formed to cover at least the piezoelectric layer 740 disposed on the upper portion of the cavity C. The second electrode 750 may be used as either an input electrode or an output electrode for inputting and/or outputting an electrical signal such as a radio frequency (RF) signal. For example, when the first electrode 730 is used as an input electrode, the second electrode 750 may be used as an output electrode, and when the first electrode 730 is used as an output electrode, the second electrode 750 may be used as an input electrode.

The second electrode 750 may be formed of an aluminum alloy containing scandium (Sc) like the first electrode 730.

The second electrode 750 may be provided with a frame portion 752 disposed at an edge of an active region, for example, a region in which the first electrode 730, the piezoelectric layer 740, and the second electrode 750 are overlapped. The frame portion 752 has a thickness greater than that of a remaining portion of the second electrode 750. In an example, the frame portion 752 reflects a lateral wave generated during resonance to an inside of the active region to confine resonance energy in the active region.

The passivation layer 760 is formed in a region except for portions of the first electrode 730 and the second electrode 750. The passivation layer 760 prevents the second electrode 750 and the first electrode 730 from being damaged during the process.

Further, a thickness of the passivation layer 760 may be adjusted by etching performed for adjustment of a frequency in an ultimate process. The passivation layer 760 may be formed using the same material as that of the membrane layer 720. For example, as the passivation layer 760, a dielectric layer including one of manganese oxide (MgO), zirconium oxide (ZrO2), aluminum nitride (AlN), lead zirconate titanate (PZT), gallium arsenic (GaAs), hafnium oxide (HfO2), aluminum oxide (Al2O3), titanium oxide (TiO2), and zinc oxide (ZnO) may be used.

The metal pad 770 is formed on portions of the first electrode 730 and the second electrode 750, in which the passivation layer 760 is not formed. As an example, the metal pad 770 may be formed of a material such as gold (Au), a gold-tin (Au—Sn) alloy, copper (Cu), a copper-tin (Cu—Sn) alloy, aluminum (aluminum), an aluminum alloy, or the like. For example, the aluminum alloy may be an aluminum-germanium (Al—Ge) alloy.

Figure 18:
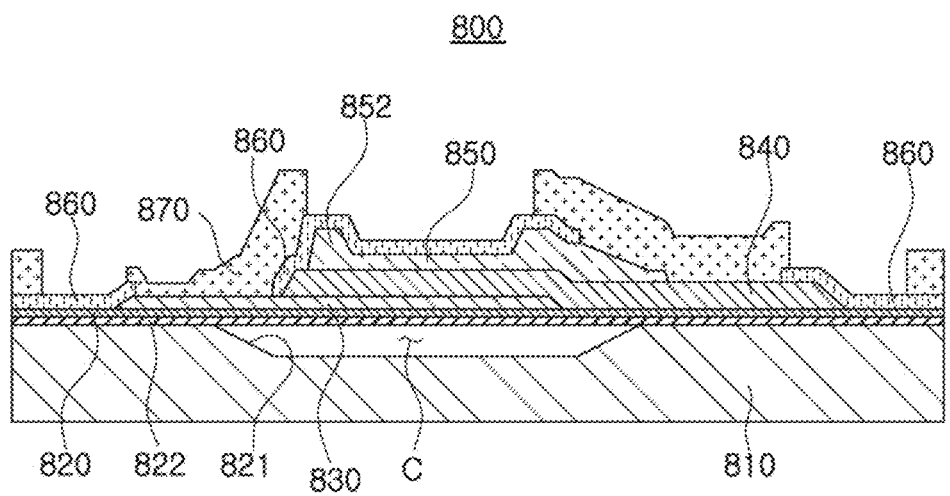
FIG. 18 is a schematic cross-sectional view illustrating a bulk acoustic wave resonator according to an example.

FIG. 18 is a schematic cross-sectional view illustrating a bulk acoustic wave resonator according to an example.

Referring to FIG. 18, an acoustic wave filter device 800 may include a substrate 810, a membrane layer 820, a first electrode 830, a piezoelectric layer 840, a second electrode 850, a passivation layer 860, and a metal pad 870, as an example.

The substrate 810 may be a substrate on which silicon is stacked. For example, a silicon wafer may be used as the substrate 810. The substrate 810 may be provided with a groove 821 for formation of a cavity C.

The groove 821 may be disposed in a central portion of the substrate 810, and may be disposed below an active region. In this case, the active region is a region in which the first electrode 830, the piezoelectric layer 840, and the second electrode 850 overlap each other.

The membrane layer 820 forms the cavity C together with the substrate 810. For example, the membrane layer 820 may be formed to cover the groove 821 of the substrate 810. As the membrane layer 820, a dielectric layer including one of silicon nitride (Si3N4), silicon oxide (SiO2), manganese oxide (MgO), zirconium oxide (ZrO2), aluminum nitride (AlN), lead zirconate titanate (PZT), gallium arsenic (GaAs), hafnium oxide (HfO2), aluminum oxide (Al2O3), titanium oxide (TiO2), and zinc oxide (ZnO) may be used.

A seed layer 822 formed of aluminum nitride (AlN) may be formed on the membrane layer 820. For example, the seed layer 822 may be disposed between the membrane layer 820 and the first electrode 830. The seed layer 822 may be formed using a dielectric or metal having an HCP crystal structure in addition to aluminum nitride (AlN). As an example, when the seed layer 822 is a metal layer, the seed layer 822 may be formed of titanium (Ti).

The first electrode 830 is formed on the membrane layer 820. The first electrode 830 may be used as either an input electrode or an output electrode for inputting and/or outputting an electrical signal such as a radio frequency (RF) signal.

The first electrode 830 may be formed of an aluminum alloy containing scandium (Sc) as an example. As described above, since the first electrode 830 is formed of an aluminum alloy containing scandium (Sc), mechanical strength may be increased and high power reactive sputtering may be performed. An increase in surface roughness of the first electrode 830 may be prevented, and high orientation growth of the piezoelectric layer 840 may be induced under such deposition conditions.

Since the scandium (Sc) is present, chemical resistance of the first electrode 830 increases, and a disadvantage that occurs in a case in which the first electrode is formed of pure aluminum may be compensated for. Process stability such as dry etching or wet processing may be secured in manufacturing. Further, in a case in which the first electrode is formed of pure aluminum, oxidation is easily caused. However, since the first electrode 830 is formed of an aluminum alloy containing scandium, chemical resistance to oxidation may be improved.

The first electrode 830 is formed of an aluminum alloy (AlSc) containing only scandium (Sc), and thus, the polarity of the piezoelectric layer 840 disposed on the first electrode 830 may be a cation (Al) polarity (see FIG. 9).

The piezoelectric layer 840 is formed to cover at least a portion of the first electrode 830. The piezoelectric layer 840 is formed of one of aluminum nitride (AlN), zinc oxide (ZnO) and lead zirconium titanium oxide (PZT; PbZrTiO), and is a part causing a piezoelectric effect to convert electrical energy into mechanical energy in the form of acoustic waves. When the piezoelectric layer 840 is formed of aluminum nitride (AlN), the piezoelectric layer 840 may further include a rare earth metal. As an example, the rare earth metal may include at least one of scandium (Sc), erbium (Er), yttrium (Y), and lanthanum (La). Also, as an example, a transition metal may include at least one of titanium (Ti), zirconium (Zr), hafnium (Hf), tantalum (Ta), and niobium (Nb). Magnesium (Mg), a divalent metal, may also be included.

Also, the piezoelectric layer 840 has a cation (Al) polarity (see FIG. 9). For example, since the first electrode 830 is formed of an aluminum alloy containing scandium (Sc), the piezoelectric layer 840 stacked on the first electrode 830 may have a cation (Al) polarity. Thus, the piezoelectric layer 840 may have a sufficiently large thickness while the piezoelectric layer 840 is sufficiently ensured in crystal orientation. In addition, a high frequency may be implemented by further increasing the thickness of the piezoelectric layer 840.

The second electrode 850 is formed to cover at least the piezoelectric layer 840 disposed on the upper portion of the cavity C. The second electrode 850 may be used as either an input electrode or an output electrode for inputting and/or outputting an electrical signal such as a radio frequency (RF) signal. For example, when the first electrode 830 is used as an input electrode, the second electrode 850 may be used as an output electrode, and when the first electrode 830 is used as an output electrode, the second electrode 850 may be used as an input electrode.

The second electrode 850 may be formed of an aluminum alloy containing scandium (Sc) like the first electrode 830.

The second electrode 850 may be provided with a frame portion 852 disposed at an edge of the active region. The frame portion 852 has a thickness greater than that of a remaining portion of the second electrode 850. As an example, the frame unit 852 reflects a lateral wave generated during resonance to an inside of the active region to confine resonance energy in the active region.

The passivation layer 860 is formed in a region except for portions of the first electrode 830 and the second electrode 850. The passivation layer 860 prevents the second electrode 850 and the first electrode 830 from being damaged during a process.

Further, the passivation layer 860 may be adjusted in thickness in a final process by etching, to control a frequency. The passivation layer 860 may be formed using the same material as a material used for the membrane layer 820. As an example, as the passivation layer 860, a dielectric layer including one of manganese oxide (MgO), zirconium oxide (ZrO2), aluminum nitride (AlN), lead zirconate titanate (PZT), gallium arsenic (GaAs), hafnium oxide (HfO2), aluminum oxide (Al2O3), titanium oxide (TiO2), and zinc oxide (ZnO) may be used.

The metal pad 870 is formed on portions of the first electrode 830 and the second electrode 850, in which the passivation layer 860 is not formed. As an example, the metal pad 870 may be formed of a material such as gold (Au), a gold-tin (Au—Sn) alloy, copper (Cu), a copper-tin (Cu—Sn) alloy, aluminum (Al), or the like. For example, the aluminum alloy may be an aluminum-germanium (Al—Ge) alloy.

Figure 19:
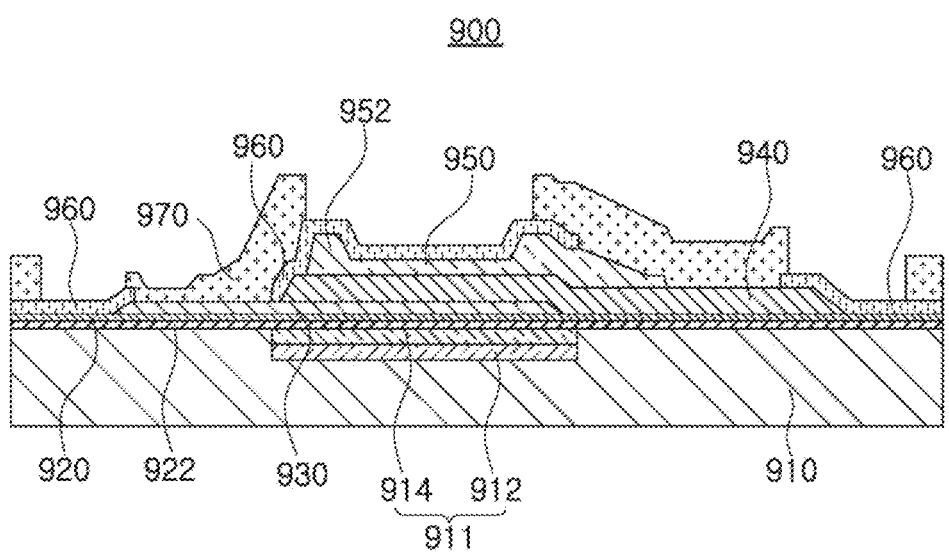
FIG. 19 is a schematic cross-sectional view illustrating a bulk acoustic wave resonator according to an example.

FIG. 19 is a schematic cross-sectional view illustrating a bulk acoustic wave resonator according to an example.

Referring to FIG. 19, a bulk acoustic wave resonator 900 may include a substrate 910, a membrane layer 920, a first electrode 930, a piezoelectric layer 940, a second electrode 950, a passivation layer 960, and a metal pad 970.

The substrate 910 may be a substrate on which silicon is stacked. For example, a silicon wafer may be used as the substrate 910. A reflective layer 911 may be provided on the substrate 910.

The reflective layer 911 may be disposed at a central portion of the substrate 910, and may be disposed below an active region. In this case, the active region is a region in which the first electrode 930, the piezoelectric layer 940, and the second electrode 950 are overlapped with each other.

The reflective layer 911 may include first and second reflective members 912 and 914 disposed in the groove. The first and second reflective members 912 and 914 may be formed of different materials.

The first reflective member 912 may be formed using a conductive material such as molybdenum (Mo) or an alloy thereof, but a configuration of the first reflective member 912 is not limited thereto. For example, as a material of the first reflective member 912, ruthenium (Ru), tungsten (W), iridium (Ir), platinum (Pt), copper (Cu), aluminum (Al), titanium (Ti), tantalum (Ta), nickel (Ni), chromium (Cr), or the like may be used. As the second reflective member 914, a dielectric layer including one of silicon nitride (Si3N4), silicon oxide (SiO2), manganese oxide (MgO), zirconium oxide (ZrO2), aluminum nitride (AlN), lead zirconate titanate (PZT), gallium arsenic (GaAs), hafnium oxide (HfO2), aluminum oxide (Al2O3), titanium oxide (TiO2), and zinc oxide (ZnO) may be used. Also, the first and second reflective members 912 and 914 may only be formed as a pair, or the first and second reflective members 912 and 914 may be repeatedly formed as a pair.

The membrane layer 920 may be formed to cover the reflective layer 911 of the substrate 910. As the membrane layer 920, a dielectric layer including one of silicon nitride (Si3N4), silicon oxide (SiO2), manganese oxide (MgO), zirconium oxide (ZrO2), aluminum nitride (AlN), lead zirconate titanate (PZT), gallium arsenic (GaAs), hafnium oxide (HfO2), aluminum oxide (Al2O3), titanium oxide (TiO2), and zinc oxide (ZnO) may be used.

A seed layer 922 formed of aluminum nitride (AlN) may be formed on the membrane layer 920. For example, the seed layer 922 may be disposed between the membrane layer 920 and the first electrode 930. The seed layer 922 may be formed using a dielectric or metal having an HCP crystal structure in addition to aluminum nitride (AlN). As an example, when the seed layer 922 is a metal layer, the seed layer 922 may be formed of titanium (Ti).

The first electrode 930 is formed on the membrane layer 920. Also, the first electrode 930 may be used as either an input electrode or an output electrode for inputting and/or outputting an electrical signal such as a radio frequency (RF) signal.

The first electrode 930 may be formed of an aluminum alloy containing scandium (Sc) as an example. Since the first electrode 930 is formed of an aluminum alloy containing scandium (Sc), mechanical strength may be increased and high power reactive sputtering may be performed. Surface roughness of the first electrode 930 may be prevented from increasing and high orientation growth of the piezoelectric layer 940 may be induced under such deposition conditions.

Since the scandium (Sc) is present, chemical resistance of the first electrode 930 is increased, and a disadvantage that occurs in a case in which the first electrode is formed of pure aluminum may be compensated. Further, process stability such as dry etching or wet processing may be secured in manufacturing. Further, in a case in which the first electrode is formed of pure aluminum, oxidation is easily caused. However, since the first electrode 930 is formed of an aluminum alloy containing scandium, chemical resistance to oxidation may be improved.

Further, since the first electrode 930 is formed of an aluminum alloy (AlSc) containing only scandium (Sc), the polarity of the piezoelectric layer 940 disposed on an upper portion of the first electrode 930 may be a cation (Al) polarity (see FIG. 9).

The piezoelectric layer 940 is formed to cover at least a portion of the first electrode 930. The piezoelectric layer 940 is formed of one of aluminum nitride (AlN), zinc oxide (ZnO), and lead zirconium titanium oxide (PZT; PbZrTiO), and may be a part causing a piezoelectric effect to convert electrical energy into mechanical energy in the form of acoustic waves. When the piezoelectric layer 940 is composed of aluminum nitride (AlN), the piezoelectric layer 940 may further include a rare earth metal. As an example, the rare earth metal may include at least one of scandium (Sc), erbium (Er), yttrium (Y), and lanthanum (La). Also, as an example, a transition metal may include at least one of titanium (Ti), zirconium (Zr), hafnium (Hf), tantalum (Ta), and niobium (Nb). Magnesium (Mg), a divalent metal, may also be included.

Also, the piezoelectric layer 940 has a cation (Al) polarity (see FIG. 9). For example, since the first electrode 930 is formed of an aluminum alloy containing scandium (Sc), the piezoelectric layer 940 stacked on the first electrode 930 may have a cation (Al) polarity. As a result, the piezoelectric layer 940 may have a relatively great thickness while the piezoelectric layer 940 is sufficiently ensured in crystal orientation. In addition, the thickness of the piezoelectric layer 940 may be further increased to implement a high frequency.

The second electrode 950 is formed to cover at least the piezoelectric layer 940 disposed on an upper portion of a cavity C. The second electrode 950 may be used as either an input electrode or an output electrode for inputting and/or outputting an electrical signal such as a radio frequency (RF) signal. For example, when the first electrode 930 is used as an input electrode, the second electrode 950 may be used as an output electrode, and when the first electrode 930 is used as an output electrode, the second electrode 950 may be used as an input electrode.

The second electrode 950 may be formed of an aluminum alloy containing scandium (Sc) like the first electrode 930.

The second electrode 950 may be provided with a frame portion 952 disposed at an edge of the active region. The frame portion 952 has a thickness greater than that of a remaining portion of the second electrode 950. For example, the frame portion 952 reflects a lateral wave generated during resonance to an inside of the active region to confine resonance energy in the active region.

The passivation layer 960 is formed in a region except for portions of the first electrode 930 and the second electrode 950. The passivation layer 960 prevents damage to the second electrode 950 and the first electrode 930 during a process.

Further, the passivation layer 960 may be adjusted in thickness in a final process by etching to control a frequency of the passivation layer 960. The passivation layer 960 may be formed using the same material as a material used for the membrane layer 920. As an example, as the passivation layer 960, a dielectric layer including one of manganese oxide (MgO), zirconium oxide (ZrO2), aluminum nitride (AlN), lead zirconate titanate (PZT), gallium arsenic (GaAs), hafnium oxide (HfO2), aluminum oxide (Al2O3), titanium oxide (TiO2), and zinc oxide (ZnO) may be used.

The metal pad 970 is formed on portions of the first electrode 930 and the second electrode 950, in which the passivation layer 960 is not formed. As an example, the metal pad 970 may be formed of a material such as gold (Au), a gold-tin (Au—Sn) alloy, copper (Cu), a copper-tin (Cu—Sn) alloy, aluminum (Al), an aluminum alloy or the like. For example, the aluminum alloy may be an aluminum-germanium (Al—Ge) alloy.

Figure 20:
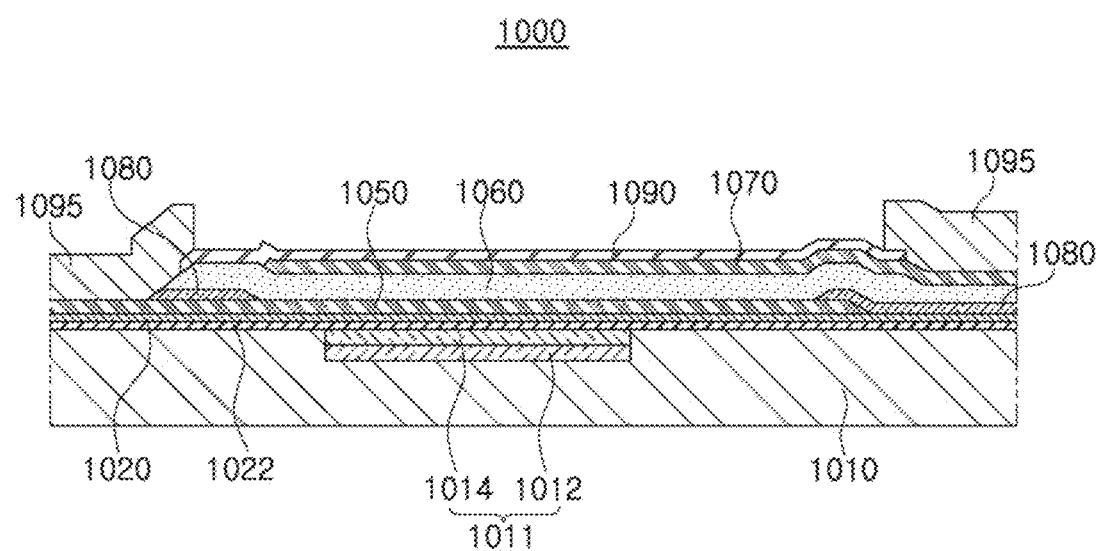
FIG. 20 is a schematic cross-sectional view illustrating a bulk acoustic wave resonator according to an example.

FIG. 20 is a schematic cross-sectional view illustrating a bulk acoustic wave resonator according to an example.

Referring to FIG. 20, a bulk acoustic wave resonator 1000 may include a substrate 1010, a membrane layer 1020, a first electrode 1050, a piezoelectric layer 1060, a second electrode 1070, an insertion layer 1080, a passivation layer 1090, and a metal pad 1095.

The substrate 1010 and the membrane layer 1020 included in the bulk acoustic wave resonator 1000 may have the same configurations included in the bulk acoustic wave resonator 900. Thus, a detailed description thereof will be omitted and substituted with the above description.

Further, the first electrode 1050, the piezoelectric layer 1060, the second electrode 1070, the insertion layer 1080, the passivation layer 1090 and the metal pad 1095, included in the bulk acoustic wave resonator 1000, are the same configurations as the first electrode 150, the piezoelectric layer 160, the second electrode 170, and the insertion layer 180, the passivation layer 190 and the metal pad 195 included in the bulk acoustic wave resonator 100. Thus, a detailed description thereof will be omitted and substituted with the above description.

The insertion layer 1080 is disposed between the first electrode 1050 and the piezoelectric layer 1060. The insertion layer 1080 may be formed of a dielectric such as silicon oxide (SiO2), aluminum nitride (AlN), aluminum oxide (Al2O3), silicon nitride (Si3N4), manganese oxide (MgO), zirconium oxide (ZrO2), lead zirconate titanate (PZT), gallium arsenic (GaAs), hafnium oxide (HfO2), aluminum oxide (Al2O3), titanium oxide (TiO2), zinc oxide (ZnO) or the like, and is formed of a material different from that of the piezoelectric layer 1060. Further, a region in which the insertion layer 1080 is provided may also be provided as air, which may be implemented by removing the insertion layer 1080 during a manufacturing process.

In this example, a thickness of the insertion layer 1080 may be the same as or similar to that of the first electrode 1050. Further, the insertion layer 1080 may be formed to have a thickness similar to or less than that of the piezoelectric layer 1060. For example, the insertion layer 1080 may be formed to have a thickness of 100 Å or more and less than that of the piezoelectric layer 1060. However, the configuration of the insertion layer 1080 is not limited thereto.

A remaining structure of the insertion layer 1080 is the same as that of the insertion layer 180 provided in the bulk acoustic wave resonator 100. Thus, a detailed description thereof will be omitted by being substituted with the above description.

As set forth above, with a bulk acoustic wave resonator according to examples in the present disclosure, $Kt^2$ may be controlled, for example, reduced, by adjusting a thickness ratio in a case in which a piezoelectric layer is stacked by mixing cation (Al) polarity and anion (N) polarity, without deteriorating other physical properties, thereby implementing a high frequency with a sufficient thickness to prevent deterioration of physical properties of the piezoelectric layer and an electrode.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave resonator comprising:
a substrate;
a seed layer disposed on the substrate;
a first electrode disposed on the seed layer and comprising an aluminum alloy layer containing scandium (Sc);
a piezoelectric layer disposed on the first electrode and comprising a layer having only a cation (Al) polarity, wherein the piezoelectric layer comprises a first piezoelectric layer disposed on the first electrode and having only the cation (Al) polarity, an oxide layer disposed directly on the first piezoelectric layer, and a second piezoelectric layer disposed directly on the oxide layer and having an anion (N) polarity, wherein a ratio of a thickness of the first piezoelectric layer to a thickness of the second piezoelectric layer ranges from 0.11 to 0.59; and
a second electrode disposed on the second piezoelectric layer.

2. A bulk acoustic wave resonator comprising:
a substrate;
a first electrode disposed on the substrate;
a piezoelectric layer disposed on the first electrode and comprising a first piezoelectric layer disposed on the first electrode and having only a cation (Al) polarity, an oxide layer disposed directly on the first piezoelectric layer, and a second piezoelectric layer disposed directly on the oxide layer and having an anion (N) polarity, wherein a ratio of a thickness of the first piezoelectric layer to a thickness of the second piezoelectric layer ranges from 1.63 to 5.25 or ranges from 0.11 to 0.59; and
a second electrode disposed on the second piezoelectric layer.

3. A bulk acoustic wave resonator comprising:
a substrate;
a seed layer disposed on the substrate;
a first electrode disposed on the seed layer and comprising an aluminum alloy layer containing scandium (Sc);
a piezoelectric layer disposed on the first electrode and comprising a layer having only a cation (Al) polarity, wherein the piezoelectric layer comprises a first piezoelectric layer disposed on the first electrode and having only the cation (Al) polarity, an oxide layer disposed directly on the first piezoelectric layer, and a second piezoelectric layer disposed directly on the oxide layer and having an anion (N) polarity, wherein a ratio of a thickness of the first piezoelectric layer to a thickness of the second piezoelectric layer ranges from 1.63 to 5.25; and
a second electrode disposed on the second piezoelectric layer.

4. The bulk acoustic wave resonator of claim 3, wherein the aluminum alloy layer contains only scandium as an alloying element.

5. The bulk acoustic wave resonator of claim 3, wherein a content of scandium (Sc) contained in the first electrode is 0.1 at % to 5 at %.

6. The bulk acoustic wave resonator of claim 3, wherein a doping material of the piezoelectric layer comprises one of scandium, erbium, yttrium, lanthanum, titanium, zirconium and hafnium, or combinations thereof.

7. The bulk acoustic wave resonator of claim 6, wherein a content of the doping material in the piezoelectric layer is 0.1 at % to 30 at %.

8. The bulk acoustic wave resonator of claim 3, wherein the second electrode comprises an aluminum alloy layer containing scandium (Sc).

9. The bulk acoustic wave resonator of claim 3, wherein the second electrode is composed of at least one of molybdenum (Mo), ruthenium (Ru), tungsten (W), iridium (Ir), platinum (Pt), copper (Cu), titanium (Ti), tantalum (Ta), nickel (Ni), or chromium (Cr), or is composed of an alloy including any one thereof.

10. The bulk acoustic wave resonator of claim 3, further comprising a passivation layer disposed on the second electrode.

11. The bulk acoustic wave resonator of claim 3, further comprising an etch stop portion disposed between the substrate and the first electrode and disposed around a cavity.

12. The bulk acoustic wave resonator of claim 3, further comprising an insertion layer disposed below a portion of the piezoelectric layer.

13. The bulk acoustic wave resonator of claim 3, further comprising a cavity disposed in the substrate or above the substrate.

14. The bulk acoustic wave resonator of claim 3, wherein the substrate comprises a reflective layer embedded in a groove or stacked on the substrate.

15. The bulk acoustic wave resonator of claim 3, wherein the seed layer is disposed on a membrane layer, the membrane layer forming a cavity together with the substrate, and the seed layer is composed of aluminum nitride (AlN).

* * * * *